United States Patent
Hsu et al.

(10) Patent No.: US 10,447,466 B2
(45) Date of Patent: Oct. 15, 2019

(54) TRANSCEIVER AND CLOCK GENERATION MODULE

(71) Applicant: MEDIATEK Inc., Hsin-Chu (TW)

(72) Inventors: Ying-Yu Hsu, Hsinchu (TW); Chih-Lun Chuang, Hsinchu (TW); Po-Chun Kuo, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/229,155

(22) Filed: Dec. 21, 2018

(65) Prior Publication Data

US 2019/0222410 A1 Jul. 18, 2019

Related U.S. Application Data

(60) Provisional application No. 62/618,657, filed on Jan. 18, 2018.

(51) Int. Cl.
*H04L 7/06* (2006.01)
*H04L 7/033* (2006.01)
*H04L 7/00* (2006.01)
*H04L 7/04* (2006.01)

(52) U.S. Cl.
CPC .............. *H04L 7/06* (2013.01); *H04L 7/0041* (2013.01); *H04L 7/0091* (2013.01); *H04L 7/0331* (2013.01); *H04L 7/042* (2013.01)

(58) Field of Classification Search
CPC ....... H04L 7/06; H04L 7/0041; H04L 7/0091; H04L 7/0331; H04L 7/042
See application file for complete search history.

(56) References Cited

U.S. PATENT DOCUMENTS

| | | | | |
|---|---|---|---|---|
| 8,819,475 | B2* | 8/2014 | Iijima | G06F 1/10 713/503 |
| 2006/0123882 | A1* | 6/2006 | Ibane | G01R 31/3191 73/1.42 |
| 2007/0118251 | A1* | 5/2007 | Tseng | G11C 29/02 700/254 |
| 2008/0201597 | A1* | 8/2008 | Chong | G11C 7/1066 713/401 |
| 2010/0085099 | A1* | 4/2010 | Ma | G06F 1/06 327/295 |

* cited by examiner

*Primary Examiner* — Freshteh N Aghdam
(74) *Attorney, Agent, or Firm* — McClure, Qualey & Rodack, LLP

(57) ABSTRACT

A transceiver and a clock generation module are provided. The transceiver includes a receiver and the clock generation module. The receiver receives a receiving-input-data and a receiving-input-strobe. The receiver includes a data-receiving circuit for delaying the receiving-input-data and a strobe-receiving circuit for delaying the receiving-input-strobe. The clock generation module includes a calibration circuit, a phase-compensation module, and a multi-phase signal generator. The phase-compensation module compensates one of the data-receiving circuit and the strobe-receiving circuit according to a data-phase-compensation signal and a strobe-phase-compensation signal generated by the calibration circuit. The multi-phase signal generator generates shifted system-clock signals. A phase difference between the first and the second shifted system-clock signals is equivalent to a phase difference between the receiving-path-data and the receiving-path-strobe.

19 Claims, 14 Drawing Sheets

TRANSCEIVER AND CLOCK GENERATION MODULE

This application claims the benefit of U.S. provisional application Ser. No. 62/618,657, filed Jan. 18, 2018, the disclosure of which is incorporated by reference herein in its entirety.

TECHNICAL FIELD

The disclosure relates in general to a transceiver and a clock generation module, and more particularly to a transceiver and a clock generation module capable of adaptively calibrating phases of signals.

BACKGROUND

Data strobe encoding is an encoding scheme used in digital circuits, for example, double data rate (hereinafter, DDR) synchronous dynamic random access memory (hereinafter, SDRAM), for transmitting/receiving data. The data strobe encoding involves two signals, that is, a data signal (DQ) and a strobe signal (DQS). In short, the strobe signal (DQS) is utilized to synchronize the data signal (DQ) under the circumstance that a phase difference between the strobe signal (DQS) and the data signal (DQ) is maintained.

Both the data signal (DQ) and the strobe signal (DQS) are clock-based signals, and different phases of the data strobe encoding rely on multi-phase memory-clock signals. In a conventional transceiver architecture, a phase-locked loop (hereinafter, PLL) clock generator for generating multi-phase memory-clock signals is the source of all necessary phase clocks. As wiring lengths of the phase signals provided to the data/strobe reception/transmission path are different, the accuracy of the phase relationships cannot be guaranteed. Moreover, in a real operation environment, the process, voltage, and temperature (hereinafter, PVT) variation may cause the changes of the multi-phase memory-clock signals.

In other words, the relationships between phases of the data signal (DQ) and the strobe signal (DQS) may distort, and this may degrade performance and data accuracy.

SUMMARY

The disclosure is directed to a transmitter and a clock generation module. The transmitter includes a transmitter, a receiver, and the clock generation module. With the clock generation module, phases of signals related to the transmitter and the receiver can be freely and instantaneously adjusted.

According to one embodiment, a transceiver is provided. The transceiver includes a receiver and a clock generation module. The receiver receives a receiving-input-data (DQrd) and a receiving-input-strobe (DQSrd), wherein the receiving-input-data (DQrd) and the receiving-input-strobe (DQSrd) have a receiving-input phase difference (θrdDiff). The receiver includes a data-receiving circuit and a strobe-receiving circuit. The data-receiving circuit delays the receiving-input-data (DQrd) and accordingly generates a receiving-delayed-data (DQrd_dly). The strobe-receiving circuit delays the receiving-input-strobe and accordingly generates a receiving-delayed-strobe (DQSrd_dly). The clock generation module is electrically connected to the receiver. The clock generation module includes a calibration circuit and a phase-compensation module. The calibration circuit selectively generates one of a first set of phase control signals including a strobe-phase-compensation signal (SDQScmp) and a second set of phase control signals including a data-phase-compensation signal (SDQcmp). The phase-compensation module includes a data-phase-compensation circuit, a strobe-phase-compensation circuit, and a multi-phase signal generator. The data-phase-compensation circuit is electrically connected to the data-receiving circuit and the calibration circuit. The data-phase-compensation circuit generates a receiving-path-data (DQrx) by delaying the receiving-delayed-data (DQrd_dly) with a receiving-data compensation (θDQcmp) when the data-phase-compensation signal (SDQcmp) is generated. The strobe-phase-compensation circuit is electrically connected to the strobe-receiving circuit and the calibration circuit. The strobe-phase-compensation circuit generates a receiving-path-strobe (DQSrx) by delaying the receiving-delayed-strobe (DQSrd_dly) with a receiving-strobe compensation (θDQScmp) when the strobe-phase-compensation signal (SDQScmp) is generated. The receiving-path-data (DQrx) and the receiving-path-strobe (DQSrx) have a receiving-path phase difference (θrxDiff) which is different from the receiving-input phase difference (θrdDiff). The multi-phase signal generator is electrically connected to the calibration circuit. The multi-phase signal generator generates a first shifted system-clock signal (sCKp1) and a second shifted system-clock signal (sCKp2) based on a system-clock signal (sCKin). A first shifted system-clock difference between the second shifted system-clock signal (sCKp2) and the first shifted system-clock signal (sCKp1) is equivalent to the receiving-path phase difference (θrxDiff).

According to another embodiment, a clock generation module is provided. The clock generation module is electrically connected to a receiver, wherein the receiver receives a receiving-input-data ($DQ_{rd}$) and a receiving-input-strobe ($DQS_{rd}$). The receiving-input-data ($DQ_{rd}$) and the receiving-input-strobe ($DQS_{rd}$) have a receiving-input phase difference ($\theta_{rdDiff}$). The receiving-input-data ($DQ_{rd}$) is delayed to generate a receiving-delayed-data ($DQS_{rd\_dly}$), and the receiving-input-strobe ($DQS_{rd}$) is delayed to generate a receiving-delayed-strobe ($DQS_{rd\_dly}$). The clock generation module includes a calibration circuit, a phase-compensation module, and a multi-phase signal generator. The calibration circuit selectively generates one of a first set of phase control signals including a strobe-phase-compensation signal ($S_{DQScmp}$) and a second set of phase control signals including a data-phase-compensation signal ($S_{DQcmp}$). The phase-compensation module includes a data-phase-compensation circuit and a strobe-phase-compensation circuit. The data-phase-compensation circuit is electrically connected to the receiver. The data-phase-compensation circuit generates a receiving-path-data ($DQ_{rx}$) by delaying the receiving-delayed-data ($DQ_{rd\_dly}$) with a receiving-data compensation ($\theta_{DQcmp}$) when the data-phase-compensation signal ($S_{DQcmp}$) is generated. The strobe-phase-compensation circuit is electrically connected to the strobe-receiving circuit and the calibration circuit. The strobe-phase-compensation circuit generates a receiving-path-strobe ($DQS_{rx}$) by delaying the receiving-delayed-strobe ($DQS_{rd\_dly}$) with a receiving-strobe compensation ($\theta_{DQScmp}$) when the strobe-phase-compensation signal ($S_{DQScmp}$) is generated. The receiving-path-data ($DQ_{rx}$) and the receiving-path-strobe ($DQS_{rx}$) have a receiving-path phase difference ($\theta_{rxDiff}$) which is different from the receiving-input phase difference ($\theta_{rdDiff}$). The multi-phase signal generator is electrically connected to the calibration circuit. The multi-phase signal generator generates a first shifted system-clock signal (sCKp1) and a second shifted system-clock signal (sCKp2) based on a system-clock signal (sCKin). A first shifted system-clock difference between the second shifted system-clock signal (sCKp2) and the first shifted system-clock signal (sCKp1) is equivalent to the receiving-path phase difference ($\theta_{rxDiff}$).

According to still another embodiment, a transceiver is provided. The transceiver includes a receiver and a clock generation module. The receiver receives a receiving-input-data ($DQ_{rd}$) and a receiving-input-strobe ($DQS_{rd}$), wherein the receiving-input-data ($DQ_{rd}$) and the receiving-input-strobe ($DQS_{rd}$) have a receiving-input phase difference ($\theta_{rdDiff}$). The receiver includes a data-receiving circuit and a strobe-receiving circuit. The data-receiving circuit delays the receiving-input-data ($DQ_{rd}$) and accordingly generates a receiving-delayed-data ($DQ_{rd\_dly}$). The strobe-receiving circuit delays the receiving-input-strobe and accordingly generates a receiving-delayed-strobe ($DQS_{rd\_dly}$). The clock generation module is electrically connected to the receiver. The clock generation module includes a calibration circuit and a phase-compensation module. The calibration circuit selectively generates one of a data-phase-compensation signal ($S_{DQcmp}$) and a strobe-phase-compensation signal ($S_{DQScmp}$) based on a phase difference between the receiving-delayed-data ($DQS_{rd\_dly}$), and the receiving-delayed-strobe ($DQS_{rd\_dly}$). The phase-compensation module includes a data-phase-compensation circuit and a strobe-phase-compensation circuit. The data-phase-compensation circuit is electrically connected to the data-receiving circuit and the calibration circuit. The data-phase-compensation circuit generates a receiving-path-data ($DQ_{rx}$) by delaying the receiving-delayed-data ($DQ_{rd\_dly}$) with a receiving-data compensation ($\theta_{DQcmp}$) according to the data-phase-compensation signal ($S_{DQcmp}$). The strobe-phase-compensation circuit is electrically connected to the strobe-receiving circuit and the calibration circuit. The strobe-phase-compensation circuit generates a receiving-path-strobe ($DQS_{rx}$) by delaying the receiving-delayed-strobe ($DQS_{rd\_dly}$) with a receiving-strobe compensation ($\theta_{DQScmp}$) according to the strobe-phase-compensation signal ($S_{DQScmp}$). The receiving-path-data ($DQ_{rx}$) and the receiving-path-strobe ($DQS_{rx}$) have a receiving-path phase difference ($\theta_{rxDiff}$) which is different from the receiving-input phase difference ($\theta_{rdDiff}$).

Figure 1:
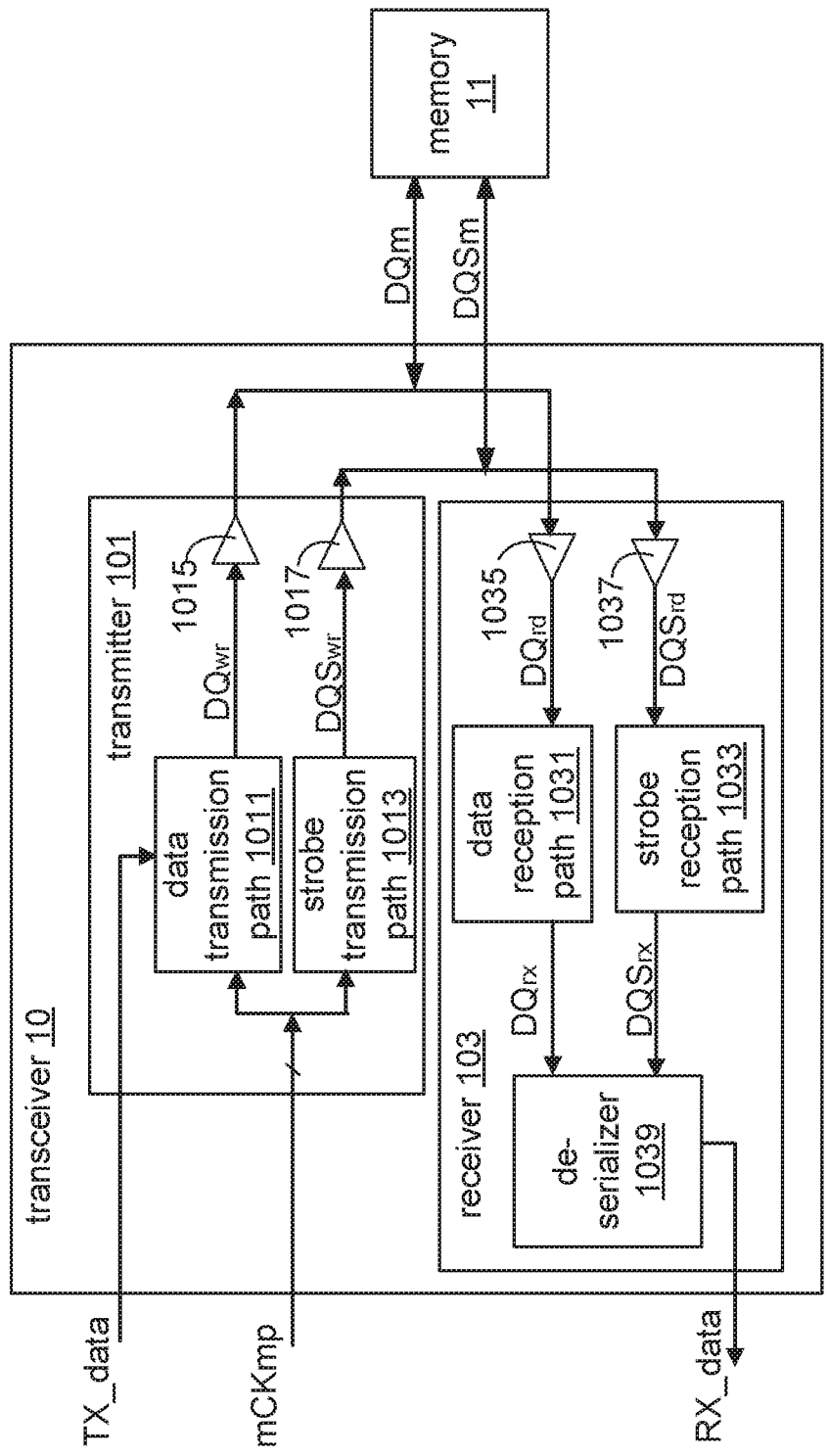
FIG. 1 is a schematic diagram illustrating a transceiver.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

As mentioned above, phases control is an essential issue in memory access or other devices using the strobe signal. A transceiver capable of adaptively calibrating phases of the strobe signal and the data signal is provided. The transceiver can be an interface circuit used together with a memory controller or different types of function circuit.

FIG. 1 is a schematic diagram illustrating a transceiver utilizing a bidirectional strobe signal to access a memory. The transceiver 10 includes a transmitter 101 for a memory write operation and a receiver 103 for memory read operation. The transmitter 101 transmits write data to the memory 11, and the receiver 103 receives read data from memory 11. The transmitter 101 and the memory 11 use a bi-directional bus to exchange memory data signal DQm and memory strobe signal DQSm.

The transmitter 101 includes a data transmission path 1011, a data output buffer 1015, a strobe transmission path 1013, and a strobe output buffer 1017. The signal transmission flow of the memory write operation is briefly illustrated. After receiving the transmission data TX_data and the multi-phase memory-clock signals mCKmp, the data transmission path 1011 generates the transmitting-output-data $DQ_{wr}$. Then, the transmitting-output-data $DQ_{wr}$ are transmitted to the data output buffer 1015. On the other hand, the strobe transmission path 1013 receives the multi-phase memory-clock signals mCKmp and generates the transmitting-output-strobe $DQS_{wr}$. Then, the transmitting-output-strobe $DQS_{wr}$ is transmitted to the strobe output buffer 1017. Afterwards, the transmitting-output-data $DQ_{wr}$ and the transmitting-output-strobe $DQS_{wr}$ are transmitted to the bi-directional bus and considered as the memory data signal DQm and the memory strobe signal DQSm, respectively.

The receiver 103 incudes a de-serializer 1039, a data reception path 1031, a data input buffer 1035, a strobe reception path 1033, and a strobe input buffer 1037. The signal transmission flow of the memory read operation is briefly illustrated. The memory data signal DQm and the memory strobe signal DQSm are received from the bi-directional bus. The memory data signal DQm is utilized as the receiving-input-data $DQ_{rd}$ (data signal driven by memory 11), and the memory strobe signal DQSm is utilized as the receiving-input-strobe $DQS_{rd}$ (strobe signal driven by memory 11). The data reception path 1013 receives the receiving-input-data $DQ_{rd}$ from the data input buffer 1035 and generates the receiving-path-data $DQ_{rx}$ to the de-serializer 1039. The strobe reception path 1033 receives the receiving-input-strobe $DQS_{rd}$ from the strobe input buffer 1037 and generates the receiving-path-strobe $DQS_{rx}$ to the de-serializer 1039. Then, the de-serializer 1039 generates the reception data RX_data.

Figure 2A:
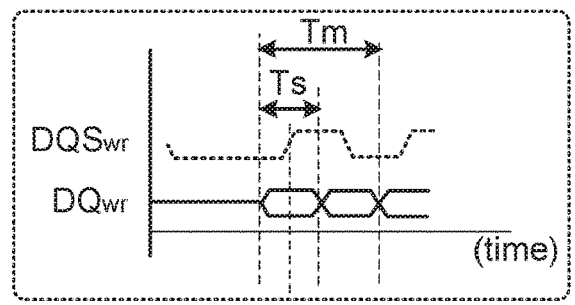
FIG. 2A is a schematic diagram illustrating the relationship between the phases of signals in the transmitter.
Figure 2B:
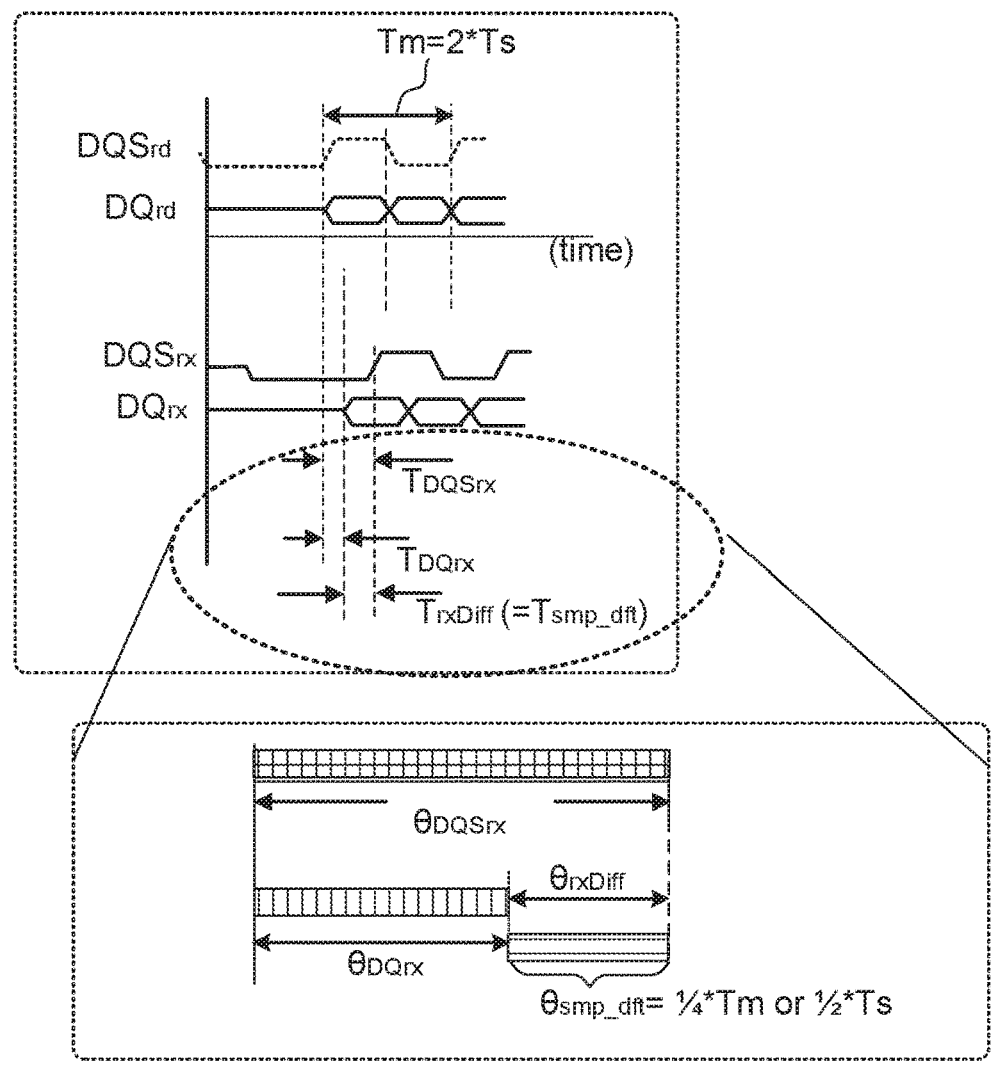
FIG. 2B is a schematic diagram illustrating a relationship between phases of signals in the receiver.

Waveforms of the data signals and strobe signals related to the operation of the transceiver are shown in FIGS. 2A and 2B. For the sake of illustration, differences between the waveforms may be referred to as phase differences or time differences in the specification.

In general, double data rate memory provides a source-synchronous design that the data signal is captured twice per clock cycle. Thus, operations of the transceiver 10 involve two types of clock signals, that is, a memory-clock signal mCK and a system-clock signal sCKin. The frequency of the memory-clock signal mCK is equivalent to half of the frequency of the system-clock signal sCKin. If the cycle of the memory-clock signal mCK is represented as Tm, and the cycle of the system-clock signal sCKin is represented as Ts, the cycle of the memory-clock signal mCK (Tm) is equivalent to twice of the cycle of the system-clock signal sCKin (Ts). That is, Tm=2*Ts. The waveforms shown in FIGS. 2A and 2B are based on the cycle of the memory-clock signal mCK.

FIG. 2A is a schematic diagram illustrating the relationship between the phases of signals in the transmitter. In FIG. 2A, the transmitting-output-strobe $DQS_{wr}$ is center-aligned relative to the transmitting-output-data $DQ_{wr}$. That is, transitions of the transmitting-output-strobe $DQS_{wr}$ occur nominally 90 degrees (relative to the mCK) out of phase with transitions of transmitting-output-data $DQ_{wr}$. Thus, the transmitting-output-strobe $DQS_{wr}$ can be used directly to capture the transmitting-output-data $DQ_{wr}$. As illustrated in FIG. 1, generation of the transmitting-output-data $DQ_{wr}$ and the transmitting-output-strobe $DQS_{wr}$ is based on the transmission data TX_data and the multi-phase memory-clock signals mCKmp. Thus, the basic premise that transmitting-output-data $DQ_{wr}$ and the transmitting-output-strobe $DQS_{wr}$ can be accurately generated is that phase differences between the multi-phase memory-clock signals mCKmp must be accurate.

FIG. 2B is a schematic diagram illustrating a relationship between phases of signals in the receiver. For memory read operation, the receiving-input-strobe $DQS_{rd}$ is assumed to be edge-aligned with the receiving-input-data $DQ_{rd}$. That is, the receiving-input-strobe $DQS_{rd}$ and the receiving-input-data $DQ_{rd}$ are clocked out of the memory by the same memory-clock signal mCK. On the other hand, the receiving-path-strobe $DQS_{rx}$ should be center-aligned with the receiving-path-data $DQ_{rx}$. Thus, the receiving-path-strobe $DQS_{rx}$ should be delayed 90 degrees out of phase of the receiving-path-data $DQ_{rx}$.

Alternatively speaking, the phase difference between the phase of the receiving-input-strobe $DQS_{rd}$ and phase of the receiving-input-data $DQ_{rd}$ (for example, edge-aligned) is different from the phase difference between the phase of the receiving-path-data ($DQ_{rx}$) and phase of the receiving-path-strobe ($DQS_{rx}$) (for example, center-aligned). In this context, the phase difference between the phase of the receiving-input-strobe $DQS_{rd}$ and phase of the receiving-input-data $DQ_{rd}$ is defined as a receiving-input phase difference ($\theta_{rdDiff}$), and the phase difference between the phase of the receiving-path-data ($DQ_{rx}$) and phase of the receiving-path-strobe ($DQS_{rx}$) is defined as a receiving-path phase difference $\theta_{rxDiff}$. The receiving-input phase difference ($\theta_{rxDiff}$) and the receiving-path phase difference ($\theta_{rxDiff}$) are different.

In FIG. 2B, the difference between the rising edge of receiving-input-strobe $DQS_{rd}$ and the rising edge of receiving-path-strobe $DQS_{rx}$ is represented as a strobe-receiving delay $T_{DQSrx}$ ($\theta_{DQSrx}$), and the difference between the rising edge of receiving-input-data $DQ_{rd}$ and the rising edge of receiving-path-data $DQ_{rx}$ is represented as a data-receiving delay $T_{DQrx}$ ($\theta_{DQrx}$). Moreover, the difference between the rising edge of receiving-path-data $DQ_{rx}$, and the rising edge of receiving-path-strobe $DQS_{rx}$ is defined as a receiving-path phase difference $T_{rxDiff}$ ($\theta_{rxDiff}$). In an ideal case, the receiving-path phase difference $T_{rxDiff}$ ($\theta_{rxDiff}$) should be equivalent to ¼*Tm (that is, 90 degrees phase difference of the memory-clock signal mCK) because the receiving-path-strobe $DQS_{rx}$ is assumed to be center-aligned with the receiving-path-data $DQ_{rx}$.

In this context, the 90 degrees phase difference is defined as a default sampling-phase $\theta_{smp\_dft}$ being designed for the strobe to sample the data. The default sampling-phase $\theta_{smp\_dft}$ is equivalent to a quarter of memory-clock ¼*Tm or half of system period ½*Ts.

For the sake of illustration, the relationship between the strobe-receiving delay $T_{DQSrx}$ ($\theta_{DQSrx}$), the data-receiving delay $T_{DQrx}$ ($\theta_{DQrx}$), and the receiving-path phase difference $\theta_{rxDiff}$ are re-drawn as horizontal bar graphs at the bottom of FIG. 2B. In this context, the grid screentone represents the strobe-receiving delay $\theta_{DQSrx}$, the vertical screentone represents the data-receiving delay $\theta_{DQrx}$, and the horizontal screentone represents the default sampling-phase $\theta_{smp\_dft}$. The length and the densities of screentone of the horizontal bars shown in FIG. 2B represent the ideal values of these phases.

Usually, the data reception path 1031 has a data-receiving circuit for controlling phase shift of the receiving-input-data $DQ_{rd}$, and the strobe-receiving circuit 1032b has a strobe-receiving circuit for controlling phase shift of the receiving-input-strobe $DQS_{rd}$. However, in a case that the data reception path 1031 includes only the data-receiving circuit and the strobe reception path 1033 includes only the strobe-receiving circuit, the phase difference between signals directly outputted by the data-receiving circuit and the strobe-receiving circuit may not be equivalent to the default sampling-phase $\theta_{smp\_dft}$. In other words, the signals directly outputted by the data-receiving circuit and the strobe-receiving circuit are not appropriate for the de-serializer 1039.

Figure 3:
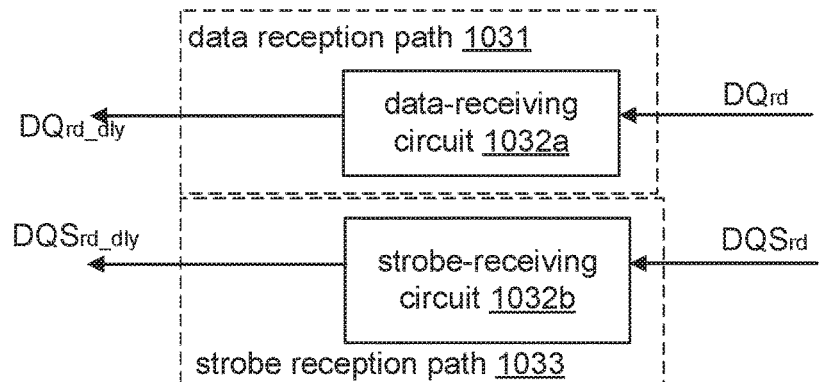
FIG. 3 is a schematic diagram illustrating a data-receiving circuit and a strobe-receiving circuit transforming the receiving-input-data $DQ_{rd}$ and the receiving-input-strobe $DQS_{rd}$ to the receiving-delayed-data $DQS_{rd\_dly}$ and the receiving-delayed-strobe $DQS_{rd\_dly}$, respectively.

FIG. 3 is a schematic diagram illustrating a data-receiving circuit and a strobe-receiving circuit transforming the receiving-input-data $DQ_{rd}$ and the receiving-input-strobe $DQS_{rd}$ to the receiving-delayed-data $DQ_{rd\_dly}$ and the receiving-delayed-strobe $DQS_{rd\_dly}$, respectively. The data-receiving circuit 1032a generates a receiving-delayed-data $DQ_{rd\_dly}$ based on the receiving-input-data $DQ_{rd}$. The strobe-receiving circuit 1032b generates a receiving-delayed-strobe $DQS_{rd\_dly}$ based on the receiving-input-strobe $DQS_{rd}$. The phase difference between the receiving-delayed-data $DQ_{rd\_dly}$ and the receiving-delayed-strobe $DQS_{rd\_dly}$ is defined as a receiving-circuit phase difference $\theta_{rcDiff\_dly}$.

In short, because of the PVT variation, the data-receiving circuit 1032a and the strobe-receiving circuit 1032b may not match to the expected design specification. In consequence, receiving-circuit phase difference $\theta_{rcDiff\_dly}$ is not equivalent to the default sampling-phase $\theta_{smp\_dft}$. Alternatively speaking, the receiving-delayed-data $DQ_{rd\_dly}$ and the receiving-delayed-strobe $DQS_{rd\_dly}$ cannot be directly used as the phase of the receiving-path-data ($DQ_{rx}$) and the receiving-path-strobe ($DQS_{rx}$), respectively. Some variant relationships between the phases shown in FIG. 2B are discussed in FIGS. 4A, 4B, 5A, and 5B.

FIGS. 4A, 4B, 5A, and 5B illustrate various combinations of phase delays caused by the data-receiving circuit 1032a and the strobe-receiving circuit 1032b. In the following, the horizontal bars having a similar type of screentone but with different densities represent the same type of phases but having non-ideal values. For example, a horizontal bar having denser grid screen tone implies the strobe-receiving delay $\theta_{DQSrx\_dly}$ is non-ideal, and so forth. In addition to the grid screentone, the vertical screentone, and the horizontal screentone, the dotted screentone is further used in FIGS. 4A, 4B, 5A, and 5B to represent a compensation phase. The compensation phase can be a receiving-strobe compensation $\theta_{DQScmp}$ related to the strobe-receiving circuit 1032b or a receiving-data compensation $\theta_{DQcmp}$ related to the data-receiving circuit 1032a.

Figures 4A, 5A:
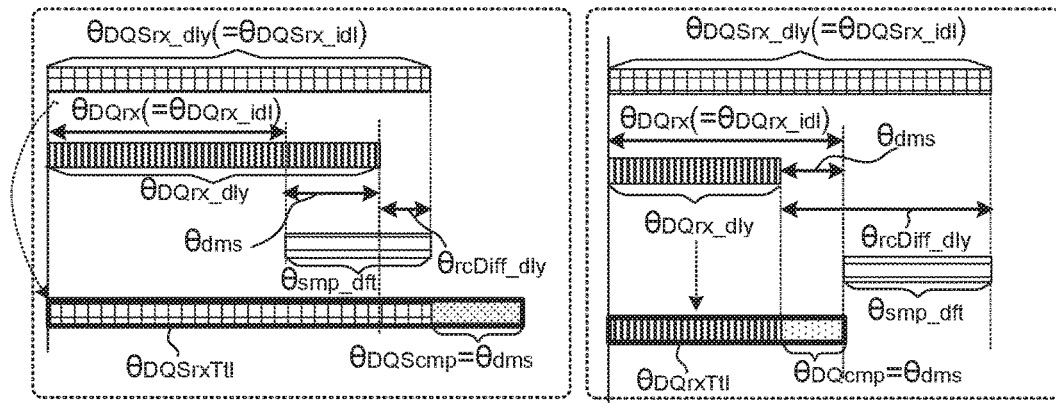
FIGS. 4A and 4B are schematic diagrams illustrating cases when the strobe-receiving circuit is compensated.
FIGS. 5A and 5B are schematic diagrams illustrating cases when the data-receiving circuit is compensated.
Figures 4B, 5B:
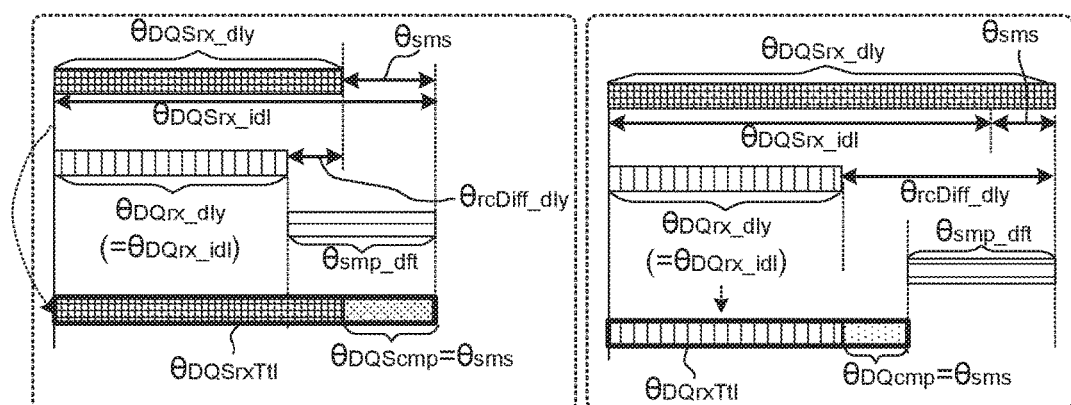

FIGS. 4A and 4B are schematic diagrams illustrating conditions when the strobe-receiving circuit is compensated.

In FIG. 4A, the strobe-receiving delay $\theta_{DQSrx\_dly}$ is assumed to be equivalent to a predefined delay of strobe-receiving circuit 1032b ($\theta_{DQSrx\_idl}$) ($\theta_{DQSrx\_dly}=\theta_{DQSrx\_idl}$), and the data-receiving delay $\theta_{DQrx\_dly}$ is assumed to be greater than a predefined delay of data-receiving circuit 1032a ($\theta_{DQrx\_idl}$) ($\theta_{DQrx\_dly}>\theta_{DQrx\_idl}$). The phase difference between the actual delay caused by the data-receiving circuit 1032a (that is, data-receiving delay $\theta_{DQrx\_dly}$) and the predefined delay of the data-receiving circuit 1032a ($\theta_{DQrx\_idl}$) is defined as phase mismatch of data-receiving circuit 1032a ($\theta_{dms}=\theta_{DQrx\_dly}-\theta_{DQrx\_idl}$). Because the data-receiving delay $\theta_{DQSrx\_dly}$ is greater than the predefined delay of data-receiving circuit 1032a ($\theta_{DQrx\_idl}$) ($\theta_{DQrx\_dly}>\theta_{DQrx\_idl}$), the receiving-circuit phase difference $\theta_{rcDiff\_dly}$ becomes less than the default sampling-phase $\theta_{smp\_dft}$.

In order to ensure the receiving-path phase difference $\theta_{rxDiff}$ is equivalent to the default sampling-phase $\theta_{smp\_dft}$, an extra delay needs to be inserted to the strobe reception path 1033. The extra delay being inserted to the strobe reception path 1033 is defined as a receiving-strobe compensation $\theta_{DQScmp}$. The receiving-strobe compensation $\theta_{DQScmp}$ is designed to be equivalent to the phase mismatch of data-receiving circuit 1032a ($\theta_{dms}$).

By additionally providing the receiving-strobe compensation $\theta_{DQScmp}$ to the strobe reception path 1033, a summarized strobe delay $\theta_{DQSrx\_Ttl}$ representing phase delay along the strobe reception path 1033 can be obtained by summing the receiving-strobe compensation $\theta_{DQScmp}$ and the strobe-receiving delay $\theta_{DQSrx\_dly}$, that is, $\theta_{DQSrx\_Ttl}=(\theta_{DQScmp}+\theta_{DQSrx\_dly})$. Thus, the difference between the summarized strobe delay $\theta_{DQSrx\_Ttl}$ and the data-receiving delay $\theta_{DQrx\_dly}$ is equivalent to the default sampling-phase $\theta_{smp\_dft}$.

In FIG. 4B, the strobe-receiving delay $\theta_{DQSrx\_dly}$ is assumed to be less than the predefined delay of strobe-receiving circuit $\theta_{DQSrx\_idl}$ ($\theta_{DQSrx\_dly}<\theta_{DQSrx\_idl}$), and the data-receiving delay $\theta_{DQrx\_dly}$ is assumed to be equivalent to the predefined delay of data-receiving circuit $\theta_{DQrx\_idl}$ ($\theta_{DQrx\_dly}=\theta_{DQrx\_idl}$). The phase difference between the actual delay caused by the strobe-receiving circuit 1032b (that is, strobe-receiving delay $\theta_{DQSrx\_dly}$) and the predefined delay of strobe-receiving circuit 1032b ($\theta_{DQSrx\_idl}$) is defined as phase mismatch of strobe-receiving circuit 1032b ($\theta_{sms}=\theta_{DQSrx\_idl}-\theta_{DQSrx\_dly}$). Because the strobe-receiving delay $\theta_{DQSrx\_dly}$ is less than the predefined delay of strobe-receiving circuit 1032b ($\theta_{DQSrx\_idl}$) ($\theta_{DQSrx\_dly}<\theta_{DQSrx\_idl}$), the receiving-path phase difference $\theta_{rxDiff}$ becomes less than the default sampling-phase $\theta_{smp\_dft}$.

Like FIG. 4A, the receiving-strobe compensation $\theta_{DQScmp}$ should be inserted to the strobe reception path 1033. In FIG. 4B, the receiving-strobe compensation ($\theta_{DQScmp}$) is designed to be equivalent to the phase mismatch of strobe-receiving circuit 1032b ($\theta_{sms}$), so that difference between the summarized strobe delay $\theta_{DQSrx\_Ttl}$ and the data-receiving delay $\theta_{DQrx\_dly}$ is equivalent to the default sampling-phase $\theta_{smp\_dft}$.

Although the scenarios of FIGS. 4A and 4B are different, the common part of FIGS. 4A and 4B is that the receiving-circuit phase difference $\theta_{rcDiff\_dly}$ is less than the default sampling-phase $\theta_{smp\_dft}$, and the receiving-strobe compensation $\theta_{DQScmp}$ is inserted to the strobe reception path 1033. As the summarized strobe delay $\theta_{DQSrx\_Ttl}$ represents phase delay along the strobe reception path 1033, the difference between the summarized strobe delay $\theta_{DQSrx\_Ttl}$ and the data-receiving delay $\theta_{DQrx\_dly}$ is equivalent to the receiving-path phase difference ($\theta_{rxDiff}$). By inserting the receiving-strobe compensation $\theta_{DQScmp}$, the summarized strobe delay $\theta_{DQSrx\_Ttl}$ is increased, and the receiving-path phase difference $\theta_{rxDiff}$ becomes equivalent to the default sampling-phase $\theta_{smp\_dft}$.

FIGS. 5A and 5B are schematic diagrams illustrating conditions when the data-receiving circuit is compensated.

In FIG. 5A, the strobe-receiving delay $\theta_{DQSrx\_dly}$ is assumed to be equivalent to the predefined delay of strobe-receiving circuit $\theta_{DQSrx\_idl}$ ($\theta_{DQSrx\_dly}=\theta_{DQSrx\_idl}$), and the data-receiving delay $\theta_{DQrx\_dly}$ is assumed to be less than the predefined delay of data-receiving circuit 1032a ($\theta_{DQrx\_idl}$) ($\theta_{DQrx\_dly}<\theta_{DQrx\_idl}$). Because the data-receiving delay $\theta_{DQrx\_dly}$ is less than the predefined delay of data-receiving circuit 1032a ($\theta_{DQrx\_idl}$) ($\theta_{DQrx\_dly}<\theta_{DQrx\_idl}$), the receiving-circuit phase difference $\theta_{rcDiff\_dly}$ becomes greater than the default sampling-phase $\theta_{smp\_dft}$.

In order to ensure the receiving-path phase difference $\theta_{rxDiff}$ is equivalent to the default sampling-phase $\theta_{smp\_dft}$, an extra delay needs to be inserted to the data reception path 1031. The extra delay being inserted to the strobe reception path 1033 is defined as a receiving-data compensation $\theta_{DQcmp}$. The receiving-data compensation $\theta_{DQcmp}$ is designed to be equivalent to the phase mismatch of data-receiving circuit 1032a ($\theta_{dms}$).

By additionally providing the receiving-data compensation $\theta_{DQcmp}$, a summarized data delay $\theta_{DQrx\_Ttl}$ representing phase delay along the data reception path 1031 can be obtained by summing the receiving-data compensation $\theta_{DQcmp}$ and the data-receiving delay $\theta_{DQrx\_dly}$, that is, $\theta_{DQrx\_Ttl}=(\theta_{DQcmp}+\theta_{DQrx\_dly})$. Thus, the difference between the strobe-receiving delay $\theta_{DQSrx\_dly}$ and the summarized data delay $\theta_{DQSrx\_Ttl}$ is equivalent to the default sampling-phase $\theta_{smp\_dft}$.

In FIG. 5B, the strobe-receiving delay $\theta_{DQSrx\_dly}$ is assumed to be greater than the predefined delay of strobe-receiving circuit $\theta_{DQSrx\_idl}$ ($\theta_{DQSrx\_dly} > \theta_{DQSrx\_idl}$), and the data-receiving delay $\theta_{DQrx\_dly}$ is assumed to be equivalent to the predefined delay of data-receiving circuit $\theta_{DQrx\_idl}$ ($\theta_{DQrx\_dly} = \theta_{DQrx\_idl}$). Because the strobe-receiving delay $\theta_{DQSrx\_dly}$ is greater than the predefined delay of strobe-receiving circuit 1032b ($\theta_{DQSrx\_idl}$) ($\theta_{DQSrx\_dly} > \theta_{DQSrx\_idl}$), the receiving-path phase difference $\theta_{rxDiff}$ becomes greater than the default sampling-phase $\theta_{smp\_dft}$.

Like FIG. 5A, the receiving-data compensation θDQScmp should be inserted into the data reception path. In FIG. 5B, the receiving-data compensation θDQcmp is designed to be equivalent to the phase mismatch of strobe-receiving circuit 1032 (θsms), so that difference between the strobe-receiving delay θDQrx_dly and the summarized data delay θDQrx_Ttl is equivalent to the default sampling-phase θsmp_dft.

Although the scenarios of FIGS. 5A and 5B are different, the common part of FIGS. 5A and 5B is that the receiving-circuit phase difference $\theta_{rcDiff\_dly}$ is greater than the default sampling-phase $\theta_{smp\_dft}$, and the receiving-data compensation $\theta_{DQcmp}$ is inserted to the data reception path 1031. As the summarized data delay $\theta_{DQrx\_Ttl}$ represents phase delay along the data reception path 1031, the difference between the strobe-receiving delay $\theta_{DQSrx\_dly}$ and the summarized strobe delay $\theta_{DQSrx\_Ttl}$ is equivalent to the receiving-path phase difference ($\theta_{rxDiff}$). By inserting the receiving-data compensation $\theta_{DQcmp}$, the summarized data delay $\theta_{DQrx\_Ttl}$ is increased, and the receiving-path phase difference $\theta_{rxDiff}$ becomes to be equivalent to the default sampling-phase $\theta_{smp\_dft}$.

The examples shown in FIGS. 4A, 4B, 5A and 5B simplify the conditions by assuming either the strobe-receiving delay $\theta_{DQSrx\_dly}$ is equivalent to the predefined delay of strobe-receiving circuit $\theta_{DQSrx\_idl}$ ($\theta_{DQSrx\_dly} = \theta_{DQSrx\_idl}$, in FIGS. 4A and 5A) or the data-receiving delay $\theta_{DQSrx\_dly}$ is equivalent to the predefined delay of data-receiving circuit $\theta_{DQrx\_idl}$ ($\theta_{DQrx\_dly} = \theta_{DQrx\_idl}$, in FIGS. 4B and 5B). In practical application, any of the strobe-receiving delay $\theta_{DQSrx\_dly}$ and the data-receiving delay $\theta_{DQSrx\_dly}$ may be greater than/equivalent to/less than their corresponding predefined values.

When the receiving-circuit phase difference $\theta_{rcDiff\_dly}$ is less than the default sampling-phase $\theta_{smp\_dft}$, the receiving-strobe compensation $\theta_{DQScmp}$ is inserted to the strobe reception path to increase the receiving-path phase difference $\theta_{rxDiff}$. When the receiving-circuit phase difference $\theta_{rcDiff\_dly}$ is greater than the default sampling-phase $\theta_{smp\_dft}$, the receiving-data compensation $\theta_{DQcmp}$ is inserted to the data reception path to decrease the receiving-path phase difference $\theta_{rxDiff}$.

According to the embodiment of the present disclosure, a phase-compensation circuit for providing the receiving-strobe compensation $\theta_{DQScmp}$ can be used in the strobe reception path 1033, and another phase-compensation circuit for providing the receiving-data compensation $\theta_{DQcmp}$ can be used in the data reception path 1031. An embodiment of the receiver being used together with the phase-compensation circuits along the strobe reception path 1033 and the data reception path 1031 is shown in FIG. 6.

Figure 6:
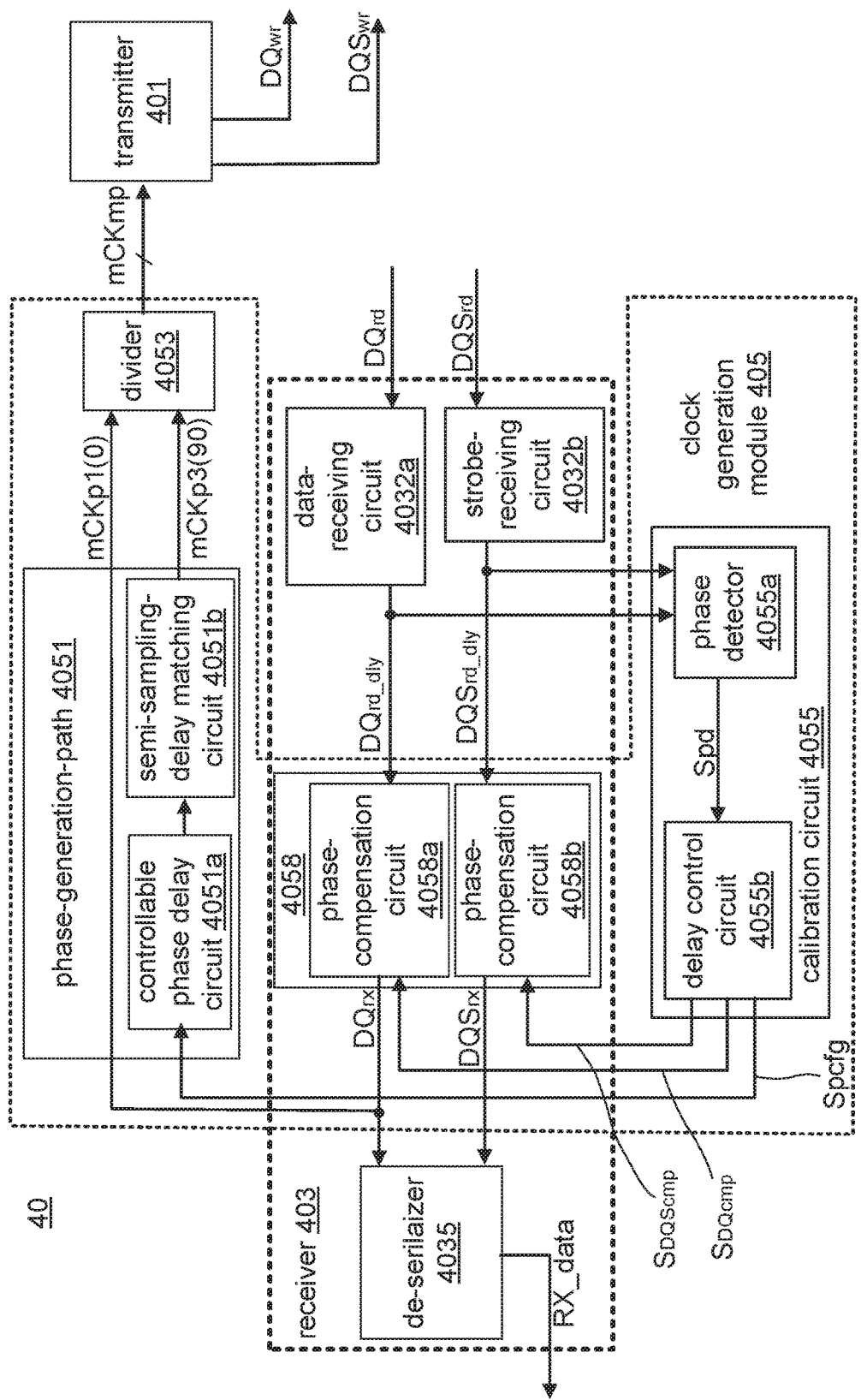
FIG. 6 is a schematic diagram illustrating the receiver is used together with a clock generation module.

FIG. 6 is a schematic diagram illustrating the receiver is used together with a clock generation module. The transceiver 40 includes a transmitter 401, a receiver 403, and a clock generation module 405. The clock generation module 405 is electrically connected to the transmitter 401 and the receiver 403.

The clock generation module 405 includes a phase-compensation module 4058, a phase-generation-path 4051, a divider 4053, and a calibration circuit 4055. The calibration circuit 4055 is electrically connected to the phase-generation-path 4051 and the phase-compensation module 4058, and the divider 4053 is electrically connected to the phase-generation-path 4051 and the transmitter 401.

The phase-compensation module 4058 includes phase-compensation circuits 4058a, 4058b, and the phase-compensation module 4058 can be integrated into the receiver 403. The phase-compensation circuit 4058a is electrically connected to the data-receiving circuit 4032a and the de-serializer 4035. The phase-compensation circuit 4058b is electrically connected to the strobe-receiving circuit 4032b and the de-serializer 4035. According to the embodiment of the present disclosure, the phase-compensation circuit 4858a is configured to provide the receiving-data compensation $\theta_{DQcmp}$, and the phase-compensation circuit 4858b is configured to provide the receiving-strobe compensation $\theta_{DQScmp}$.

The calibration circuit 4055 includes a phase detector 4055a and a delay control circuit 4055b. The phase detector 4055a is electrically connected to the data-receiving circuit 4032a, the strobe-receiving circuit 4032b, and the phase-compensation circuits 4058a, 4058b. The delay control circuit 4055b is electrically connected to the phase detector 4055a, the phase-compensation circuits 4058a, 4058b, and the phase-generation-path 4051.

The phase detector 1055a receives the receiving-delayed-data $DQ_{rd\_dly}$ and the receiving-delayed-strobe $DQS_{rd\_dly}$ from the data-receiving circuit 1032a and the strobe-receiving circuit 1032b, respectively. The phase detector 1055a compares phases of the receiving-delayed-data $DQ_{rd\_dly}$ and the receiving-delayed-strobe $DQS_{rd\_dly}$ and generates a phase comparison signal Spd representing the receiving-circuit phase difference $\theta_{rcDiff\_dly}$ to the delay control circuit 1055b. As illustrated in FIGS. 4A, 4B, 5A and 5B, the receiving-circuit phase difference $\theta_{rcDiff\_dly}$ is varied with changes of the strobe-receiving delay $\theta_{DQSrx\_dly}$ and the data-receiving delay $\theta_{DQrx\_idl}$.

The delay control circuit 4055b compares the receiving-circuit phase difference $\theta_{rcDiff\_dly}$ and the default sampling-phase $\theta_{smp\_dft}$ and determines whether they are equivalent. Then, the delay control circuit 4055b selectively generates one of the strobe-phase-compensation signal $S_{DQScm}$ and the data-phase-compensation signal $S_{DQcmp}$.

When the receiving-circuit phase difference $\theta_{rcDiff\_dly}$ is equivalent to the default sampling-phase $\theta_{smp\_dft}$, the receiving-delayed-data $DQ_{rd\_rly}$ is directly used as the receiving-path-data $DQ_{rx}$, and the receiving-delayed-strobe $DQS_{rd\_rly}$ is directly used as the receiving-path-strobe $DQS_{rx}$. Meanwhile, the delay control circuit 1055b generates none of the strobe-phase-compensation signal $S_{DQScmp}$ and the data-phase-compensation signal $S_{DQcmp}$.

When the receiving-circuit phase difference $\theta_{rcDiff\_dly}$ is less than the default sampling-phase $\theta_{smp\_dft}$, the relationship between the strobe-receiving delay $\theta_{DQSrx\_dly}$ and the data-receiving delay $\theta_{DQrx\_dly}$ is similar to the ones described in FIGS. 4A and 4B. Thus, the delay control circuit 1055a generates the strobe-phase-compensation signal $S_{DQScmp}$ to the phase-compensation circuit 4058b. The phase-compensation circuit 4058b is set by the strobe-phase-compensation signal $S_{DQScmp}$ to provide the receiving-strobe compensation $\theta_{DQScmp}$ to the strobe reception path.

By utilizing the phase-compensation circuit 4058b to provide the receiving-strobe compensation $\theta_{DQScmp}$, the receiving-path phase difference $\theta_{rxDiff}$ is greater than the receiving-circuit phase difference $\theta_{rcDiff\_dly}$, and the receiving-path phase difference $\theta_{rxDiff}$ can be adjusted to be equivalent to the default sampling-phase $\theta_{smp\_dft}$.

When the receiving-circuit phase difference $\theta_{rcDiff\_dly}$ is greater than the default sampling-phase $\theta_{smp\_dft}$, the relationship between the strobe-receiving delay $\theta_{DQSrx\_dly}$ and the data-receiving delay $\theta_{DQrx\_dly}$ is similar to the ones described in FIGS. 5A and 5B. Thus, the delay control circuit 1055a generates the data-phase-compensation signal $S_{DQcmp}$ to the phase-compensation circuit 4058a. The phase-compensation circuit 4058a is set by the data-phase-compensation signal $S_{DQcmp}$ to provide the receiving-data compensation $\theta_{DQcmp}$ to the data reception path. By utilizing the phase-compensation circuit 4058a to provide the receiving-data compensation $\theta_{DQcmp}$, the receiving-path phase difference $\theta_{rxDiff}$ can be adjusted to be equivalent to the default sampling-phase $\theta_{smp\_dft}$.

With the calibration circuit 4055 and phase-compensation circuits 4058a, 4058b, the receiver 403 is capable of maintaining the receiving-path phase difference $\theta_{rxDiff}$ as the default sampling-phase $\theta_{smp\_dft}$.

As for the phases of the transmitter 401, the phase-generation-path 4051 and the divider 4053 are provided to generate the multi-phase memory-clock signals mCKmp. The phase-generation-path 4051 includes a controllable phase-delay circuit 4051a and a semi-sampling-delay matching circuit 4051b. The semi-sampling-delay matching circuit 4051b provides a semi-default sampling-phase being equivalent to half of the default sampling-phase $\theta_{smp\_dft}$ (that is, $½*\theta_{smp\_dft}$).

According to the embodiment of the present disclosure, the delay control circuit 1055b transmits a phase-configuration signal $S_{pcfg}$ to the controllable phase-delay circuit 4051a. Generation of the phase-configuration signal $S_{pcfg}$ is related to the data-phase-compensation signal $S_{DQcmp}$ and the strobe-phase-compensation signal $S_{DQScmp}$. When the data-phase-compensation signal $S_{DQcmp}$ is generated, the phase-configuration signal $S_{pcfg}$ is equivalent to half of the receiving-data compensation $\theta_{DQcmp}$. When the strobe-phase-compensation signal $S_{DQScmp}$ is generated, the phase-configuration signal $S_{pcfg}$ is equivalent to half of the receiving-strobe compensation $\theta_{DQScmp}$.

The block diagram shown in FIG. 6 is an exemplary design of a transceiver having symbiont multiple phase generation and alignment function for the transmitter 401 and the receiver 403. In this embodiment, phase control of the transmitter 401 is dependent on the signals in the receiver 403. Thus, the embodiment shown in FIG. 6 can be utilized when the transceiver 40 operates at the initial stage.

According to the embodiment of the present disclosure, the phase-compensation circuits 4058a, 4058b and the controllable phase-delay circuit are controllable delay elements (hereinafter, CDE). Implementation of the CDE is not limited. For example, the CDE can be an analog device or a digital device (for example, digitally controlled delay-line (hereinafter, DCDL)).

The scheme shown in FIG. 6 directly utilizes signals in the receiver for phase alignment. As for the scheme shown in FIG. 7, an independent clock generation module and the system-clock signal sCKin from an external source are provided for phase alignment. As the clock generation module operates independently, the transmitter and the receiver can be calibrated simultaneously. Alternative speaking, the transceiver shown in FIG. 7 has a real time self-phase-adjusting function and can be applied in the initial stage and the normal operation stage (on-the-fly calibration).

Figure 7:
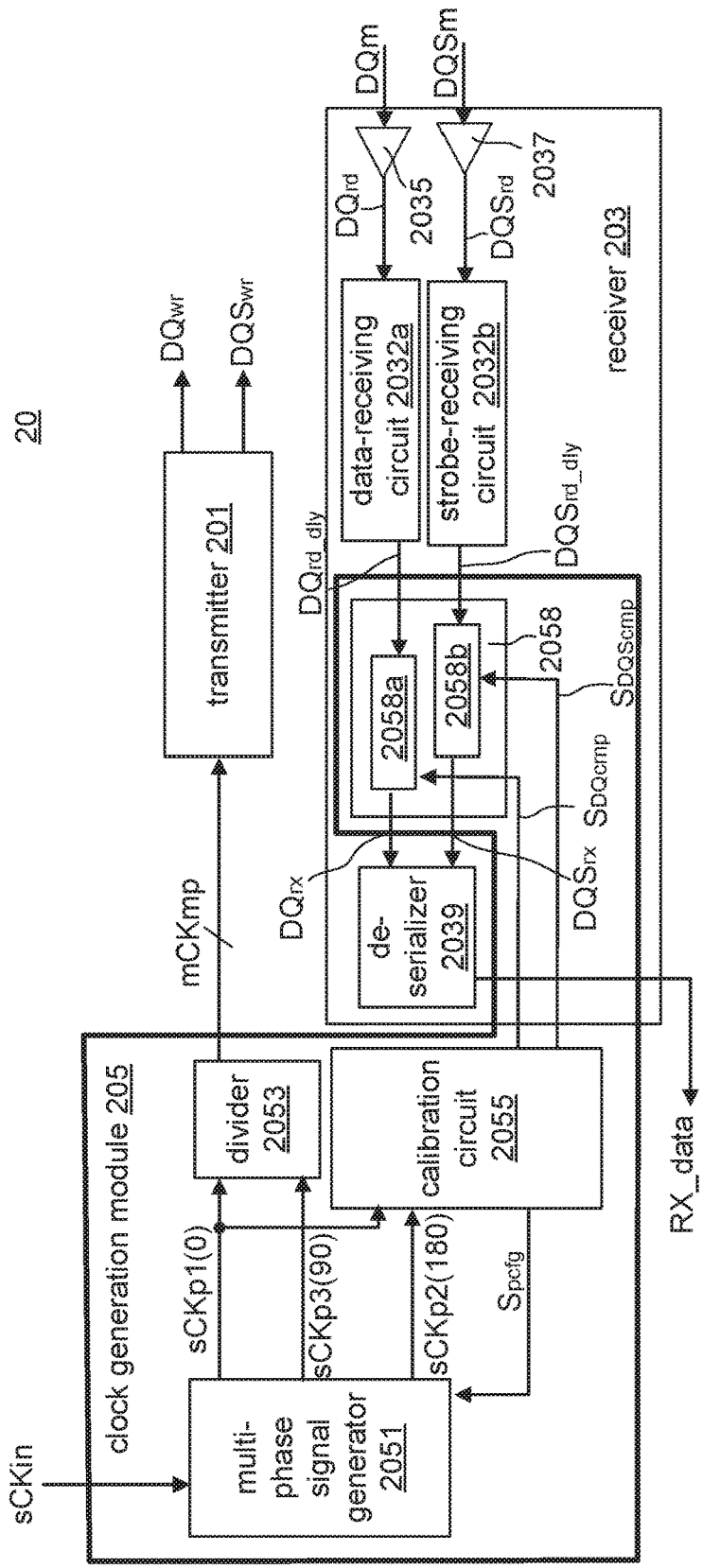
FIG. 7 is a schematic diagram illustrating the transceiver having self-phase-adjusting function according to the embodiment of the present disclosure.

FIG. 7 is a schematic diagram illustrating the transceiver having self-phase-adjusting function according to the embodiment of the present disclosure. The transceiver 20 includes a transmitter 201, a receiver 203, and a clock generation module 205. The receiver 203 includes a data input buffer 2035, a strobe input buffer 2037, a data-receiving circuit 2032a, a strobe-receiving circuit 2032b, and a de-serializer 2039.

The clock generation module 205 includes a multi-phase signal generator 2051, a divider 2053, and a calibration circuit 2055. The multi-phase signal generator 2051 receives a system-clock signal sCKin and generates shifted system-clock signals sCKp1(0), sCKp2(180), sCKp3(90) accordingly. There is a 90-degree-difference (equivalent to ¼*Ts) between the shifted system-clock signals sCKp1(0), sCKp3(90), and there is another 90-degree-difference (equivalent to ¼*Ts) between the shifted system-clock signals sCKp3(90), sCKp3(180). In this context, the phase differences between the shifted system-clock signals sCKp1(0), sCKp2(180), sCKp3(90) are defined as shifted system-clock differences.

The divider 2053 receives the shifted system-clock signals sCKp1(0), sCKp3(90) from the multi-phase signal generator 2051 and generates the multi-phase memory-clock signals mCKmp accordingly. The calibration circuit 2055 receives the shifted system-clock signals sCKp1(0), sCKp2(180) from the multi-phase signal generator 2051 and generates the phase-configuration signal $S_{pcfg}$. In addition, the calibration circuit 2055 selectively generates data-phase-compensation signal $S_{DQcmp}$ and the strobe-phase-compensation signal $S_{DQScmp}$, based on the shifted system-clock difference between the shifted system-clock signals sCKp2(180) and sCKp1(0).

Comparing with the calibration circuit 4055, the calibration circuit 2055 receives its input from the multi-phase signal generator 2051, not directly from the data-receiving circuit 4032a and the strobe-receiving circuit 4032b. According to the embodiment of the present disclosure, phase-generation-paths of the shifted system-clock signals sCKp1(0), sCKp2(180) are designed so that the receiving-path phase difference $\theta_{rxDiff}$ is substantially equivalent to the shifted system-clock difference between the shifted system-clock signal sCKp2(180) and the shifted system-clock signals sCKp1(0). In the specification, by keeping the shifted system-clock difference between the shifted system-clock signal sCKp2(180) and the shifted system-clock signal sCKp1(0) to be equivalent to the default sampling-phase $\theta_{smp\_dft}$, the receiving-path phase difference $\theta_{rxDiff}$ can be kept to be equivalent to the default sampling-phase $\theta_{smp\_dft}$. Relationships between the signals shown in FIG. 7 are shown and illustrated in FIG. 8.

Figure 8:
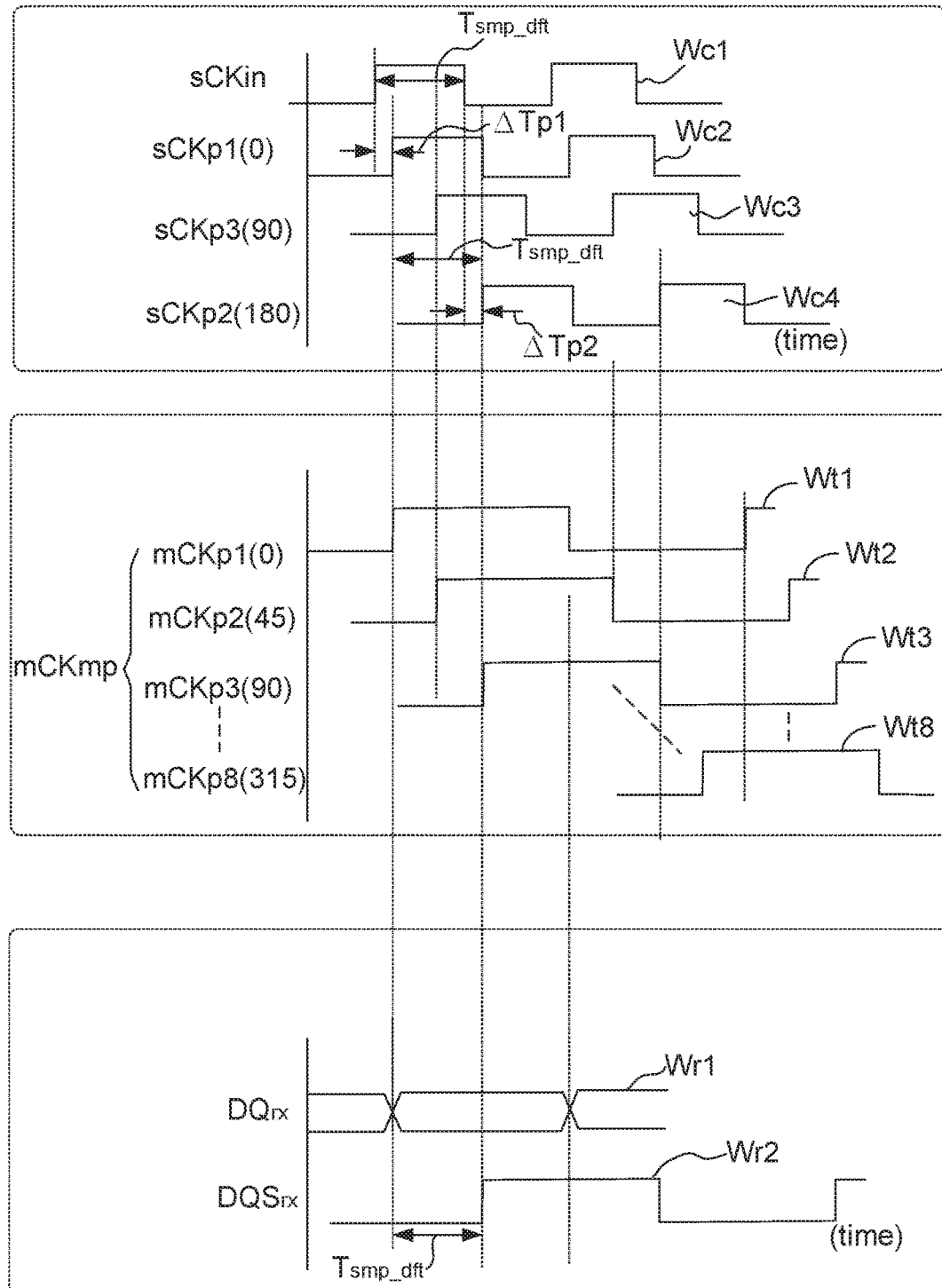
FIG. 8 is a schematic diagram illustrating the signals related to the multi-phase signal generator.

FIG. 8 is a schematic diagram illustrating the signals related to the multi-phase signal generator. FIG. 8 includes an upper part representing signals generated by the multi-phase signal generator 2051, a middle part representing the multi-phase memory-clock signals mCKmp, and a lower part representing the receiving-path-data $DQ_{rx}$ and the receiving-path-strobe $DQS_{rx}$.

In the upper part of FIG. 8, the waveforms Wc1, Wc2, Wc3, Wc4 respectively represent the system-clock signals sCKin, and the shifted system-clock signals sCKp1(0), sCKp3(90), sCKp2(180). The shifted system-clock signals sCKp1(0), sCKp3(90) represent clock signals used for signal synchronization in the transmitter 201. In an ideal case, the shifted system-clock differences between the shifted system-clock signals sCKp1(0), sCKp2(180), sCKp3(90) should have the following relationships.

Firstly, the shifted system-clock difference between the shifted system-clock signal sCKp2(180) and the shifted system-clock signal sCKp1(0) should be equivalent to 180 degrees of the system-clock signal sCKin, which is equivalent to a half cycle of the system-clock signal (½*Ts). Secondly, the shifted system-clock difference between the shifted system-clock signal sCKp3(90) and the shifted system-clock signal sCKp1(0) should be equivalent to 90 degrees of the system-clock signal sCKin, which is equivalent to a quarter cycle of the system-clock signal (¼*Ts). Moreover, the shifted system-clock difference between the shifted system-clock signal sCKp3(90) and the shifted system-clock signal sCKp1(0) should be equivalent to the shifted system-clock difference between the shifted system-clock signal sCKp2(180) and the shifted system-clock signals sCKp3(90).

In practical application, due to the PVT variation, these shifted system-clock differences may not meet the above relationships by merely using the default design of the phase-generation-paths 2051a, 2051b, 2051c. Therefore, dynamically adjusting how the shifted system-clock signals sCKp1(0), sCKp2(180), sCKp3(90) are generated must be performed whenever necessary. Through the dynamic adjustment, the shifted system-clock differences between the shifted system-clock signals sCKp1(0), sCKp2(180), sCKp3(90) can be guaranteed to be consistent with the relationships described above, regardless the PVT variation.

According to the embodiment of the present disclosure, difference between the rising edge of the system-clock signal sCKin and the rising edge of the shifted system-clock signal sCKp1(0) is defined as a first phase-difference of shifted system-clock Δtp1, and difference between rising edges of the system-clock signal sCKin and the shifted system-clock signal sCKp2(180) is defined as a second phase-difference of shifted system-clock Δtp2.

As shown in FIG. 7, the divider 2053 receives the shifted system clocks signal sCKp1(0), sCKp3(90) and generates the multi-phase memory-clock signals mCKmp accordingly. As the shifted system-clock difference between the shifted system clocks signal sCKp1(0), sCKp3(90) is equivalent to ¼*Ts (that is, ⅛*Tm), the divider 2053 is capable of generating the multi-phase memory-clock signals mCKmp having 8 different phases (0°, 45°, 90°, 135°, 180°, 225°, 270°, 315°).

In the middle part of FIG. 8, the waveforms Wt1, Wt2, Wt3, Wt8 represent the multi-phase memory-clock signals mCKmp. The waveform Wt1 corresponds to the memory-clock signal having 0° of phase shift mCKp1(0), the waveform Wt2 corresponds to the memory-clock signal having 45° of phase shift mCKp2(45), the waveform Wt3 corresponds to the memory-clock signal having 90° of phase shift mCKp3(90), and the waveform Wt8 corresponds to the memory-clock signal having 315° of phase shift mCKp8(315).

The lower part of FIG. 8 is the receiving-input-data $DQ_{rd}$ and the receiving-input-strobe $DQS_{rd}$ in the receiver 203 in an ideal case. The waveform Wr1 represents the receiving-input-data $DQ_{rd}$, and the waveform Wr2 represents the receiving-input-strobe $DQS_{rd}$. The rising edge of the waveform Wr2 is aligned to the center of the receiving-input-data $DQ_{rd}$.

The clock generation module 205 receives the system-clock signal sCKin from a clock source. The clock source can be, for example, a PLL circuit. More details about design and control mechanism of the clock generation module 205 are further illustrated in FIGS. 9A and 9B.

Figure 9A:
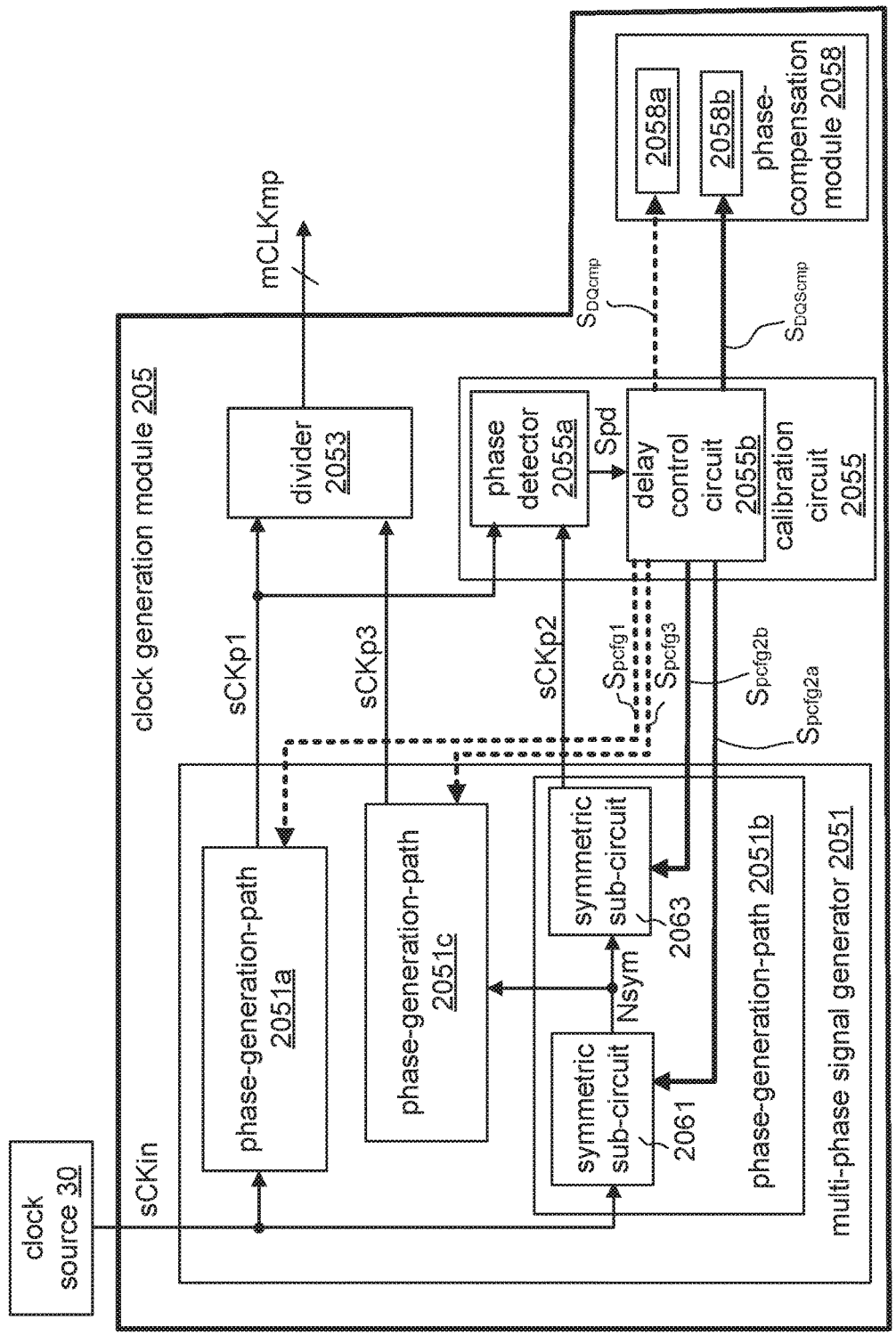
FIG. 9A is a block diagram illustrating components and signals in the clock generation module.

FIG. 9A is a block diagram illustrating components and signals in the clock generation module. The multi-phase signal generator 2051 includes phase-generation-paths 2051a, 2051b, 2051c. The phase-generation-path 2051a generates the shifted system-clock signal sCKp1(0), the phase-generation-path 2051b generates the shifted system-clock signal sCKp2(180), and the phase-generation-path 2051c generates the shifted system-clock signal sCKp3(90).

The phase-generation-paths 2051a, 2051b are electrically connected to a clock source 30 and directly receive the system-clock signal sCKin. On the other hand, the phase-generation-path 2051c is electrically connected to a symmetric terminal Nsym in the phase-generation-path 2051b. In other words, the phase-generation-path 2051c receives its input from a terminal inside the phase-generation-path 2051b.

The phase-generation-path 2051b includes symmetric sub-circuits 2061, 2063, which are electrically connected to the symmetric terminal Nsym. The symmetric sub-circuits 2061, 2063 have similar internal components and similar features, and phase delay caused by the symmetric sub-circuit 2061 is substantially equivalent to phase delay caused by the symmetric sub-circuit 2063. The symmetric sub-circuit 2061 receives and delays the system-clock signal sCKin. Then, the symmetric sub-circuit 2061 transmits its output to the symmetric terminal Nsym. The symmetric sub-circuit 2063 receives its input from the symmetric terminal Nsym. Then, the symmetric sub-circuit 2063 generates the shifted system-clock signal sCKp2(180) by delaying its input.

The calibration circuit 2055 includes a phase detector 2055a and a delay control circuit 2055b. The phase detector 2055a receives the shifted system-clock signal sCKp1(0) from the phase-generation-path 2051a and receives the shifted system-clock signal sCKp2(180) from the phase-generation-path 2051b. Then, the phase detector 2055a generates the phase comparison signal Spd to the delay control circuit 2055b based on the shifted system-clock difference between the shifted system-clock signals sCKp1(0), sCKp2(180).

The delay control circuit 2055b generates two types of phase control signals, that is, phase-configuration signals Scfg and phase-compensation signals Scmp. The phase-configuration signals Scfg ($S_{pcfg1}$, $S_{pcfg2a}$, $S_{pcfg2b}$, $S_{pcfg3}$) are transmitted to the multi-phase signal generator 2051, and the phase-compensation signals Scmp ($S_{DQcmp}$, $S_{DQScmp}$) are transmitted to the phase-compensation module 2038.

Depending relevance with the data reception path or the strobe reception path, these phase control signals can be classified into two sets. The first set of phase control signals are the ones related to the strobe reception path, that is, the phase-configuration signals $S_{pcfg2a}$, $S_{pcfg2b}$, and the strobe-phase-compensation signal $S_{DQScmp}$. The second set of phase control signals are the ones related to the data reception path, that is, the phase-configuration signals $S_{pcfg1}$, $S_{pcfg3}$, and the data-phase-compensation signal $S_{DQcmp}$. For the sake of illustration, the first set of phase control signals ($S_{pcfg2a}$, $S_{pcfg2b}$, $S_{DQScmp}$) are shown in thick arrows, and the second set of phase control signals ($S_{pcfg1}$, $S_{pcfg3}$, $S_{DQcmp}$) are shown in dotted thick arrows.

When the phase comparison signal Spd shows that the receiving-strobe compensation $\theta_{DQScmp}$ needs to be generated, the delay control circuit 2055b generates the first set of phase control signals ($S_{pcfg2a}$, $S_{pcfg2b}$, $S_{DQScmp}$). Among the first set of phase control signals ($S_{pcfg2a}$, $S_{pcfg2b}$, $S_{DQScmp}$), the phase-configuration signal $S_{pcfg2a}$ is transmitted to the symmetric sub-circuit 2061, the phase-configuration signal $S_{pcfg2b}$ is transmitted to the symmetric sub-circuit 2063, and the strobe-phase-compensation signal $S_{DQScmp}$ is transmitted to the phase-compensation circuit 2058b.

When the phase comparison signal Spd shows that the receiving-data compensation $\theta_{DQcmp}$ needs to be generated, the delay control circuit 2055b generates the second set of phase control signals ($S_{pcfg1}$, $S_{pcfg3}$, $S_{DQcmp}$). Among the second set of phase control signals ($S_{pcfg1}$, $S_{pcfg3}$, $S_{DQcmp}$), the phase-configuration signal $S_{pcfg1}$ is transmitted to the phase-generation-path 2051a, the phase-configuration signal $S_{pcfg3}$ is transmitted to the phase-generation-path 2051c, and the data-phase-compensation signal $S_{DQcmp}$ is transmitted to the phase-compensation circuit 2058a.

Figure 9B:
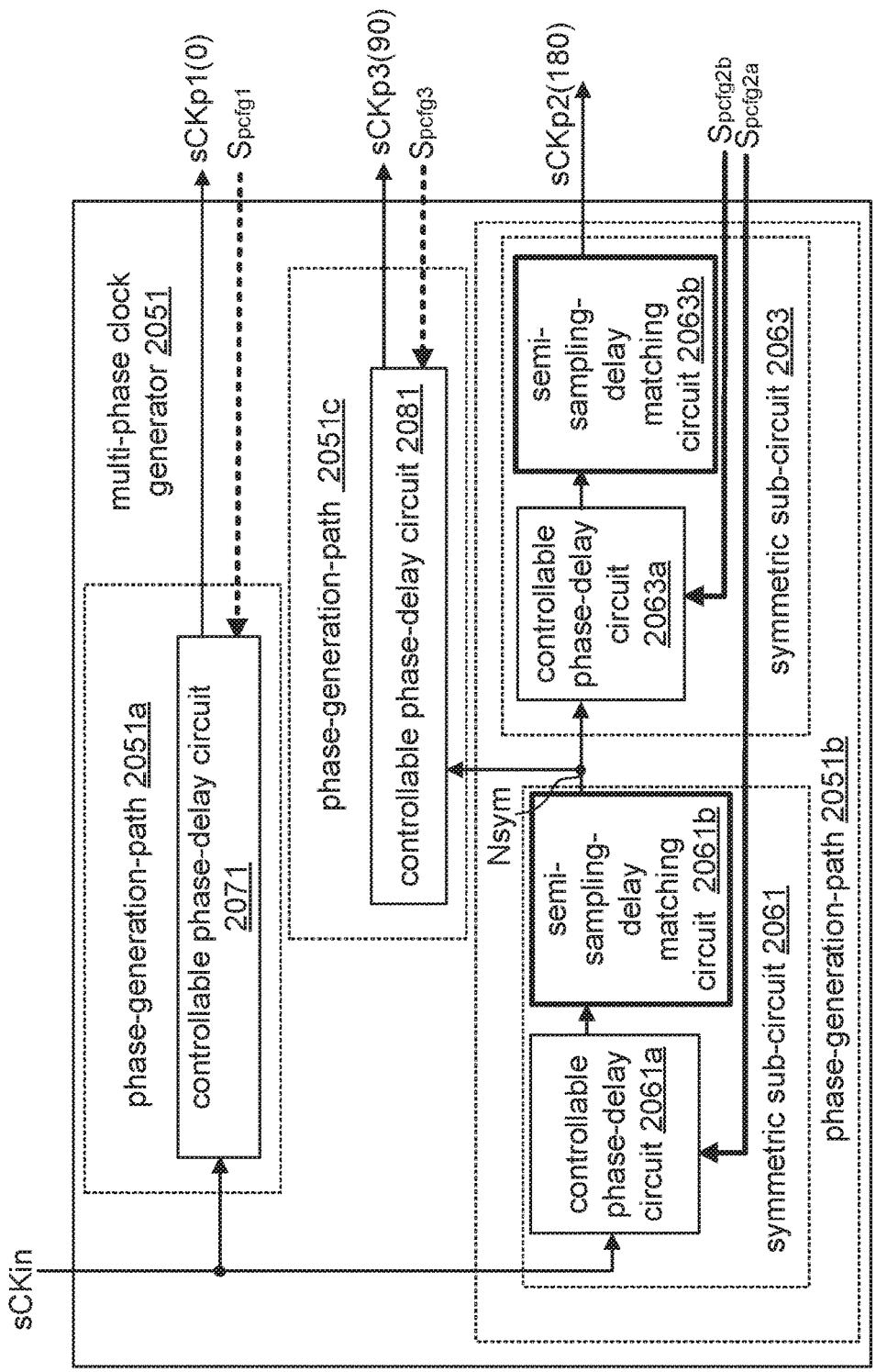
FIG. 9B is a block diagram illustrating components and signals in the multi-phase signal generator.

FIG. 9B is a block diagram illustrating components and signals in the multi-phase signal generator. The phase-generation-path 2051a includes a controllable phase-delay circuit 2071 being controlled by the phase-configuration signal $S_{pcfg1}$. The phase-generation-path 2051c includes a controllable phase-delay circuit 2081 being controlled by the phase-configuration signal $S_{pcfg3}$. The controllable phase-delay circuits 2071, 2081b are CDE circuits.

The phase-generation-path 2051b includes the symmetric sub-circuits 2061, 2063. The symmetric sub-circuit 2061 includes a controllable phase-delay circuit 2061a and a semi-sampling-delay matching circuit 2061b. The symmetric sub-circuit 2063 includes a controllable phase-delay circuit 2063a and semi-sampling-delay matching circuit 2063b. The controllable phase-delay circuits 2061a, 2063a are CDE circuits having identical delay settings. The controllable phase-delay circuit 2061a is controlled by the phase-configuration signal $S_{pcfg2a}$, and the controllable phase-delay circuit 2063a is controlled by the phase-configuration signal $S_{pcfg2b}$. Each of the semi-sampling-delay matching circuit 2061b, 2063b provides a phase delay equivalent to one half of the default sampling-phase ($\frac{1}{2}*\theta_{smp\_dft}$). The phase delays provided by the semi-sampling-delay matching circuit 2061b, 2063b are defined as a semi-default sampling-phase ($\frac{1}{2}*\theta_{smp\_dft}$), and the semi-sampling-delay matching circuit 2061b, 2063b can be implemented by clock trees.

In a case that no PVT variation exists, none of the phase control signals are generated. For the multi-phase signal generator 2051, the phase difference between the shifted system-clock signals sCKp2(180), sCKp1(0) is subtationally equivalent to the default sampling-phase $\theta_{smp\_dft}$ because each of the semi-sampling-delay matching circuits 2061b, 2063b provides a phase delay equivalent to one half of the default sampling-phase ($\frac{1}{2}*\theta_{smp\_dft}$) and the phase-generation-paths 2051a, 2051b both receive the system-clock signal sCKin as their inputs. As for the receiver 203, the receiving-circuit phase difference $\theta_{rcDiff\_dly}$ between the receiving-delayed-strobe $DQS_{rd\_dly}$ and the receiving-delayed-data $DQ_{rd\_dly}$ is subtationally equivalent to the default sampling-phase $\theta_{smp\_dft}$.

In a case that PVT variation exists, either the first set of phase control signals are generated or the second set of phase control signals are generated. Regardless the generation of the phase control signals, the phase difference between the shifted system-clock signals sCKp2(180), sCKp1(0) is no longer equivalent to the default sampling-phase $\theta_{smp\_dft}$ if PVT variation exists, so as the receiving-circuit phase difference $\theta_{rcDiff\_dly}$.

At the same time, the PVT variation caused at the data-receiving circuit 2032a and strobe-receiving circuit 2032b is similar to the PVT variation caused at the semi-sampling-delay matching circuits 2061b, 2063b. Therefore, the phase difference between the shifted system-clock signals sCKp2(180), sCKp1(0) is substantially equivalent to the receiving-circuit phase difference $\theta_{rcDiff\_dly}$.

In the specification, the phase-generation-path 2051a for generating the shifted system-clock signal sCKp1(0) can be considered as a matching path of the data-receiving circuit 2032a, and the phase-generation-path 2051b for generating the shifted system-clock signal sCKp2(180) can be considered as a matching path of the strobe-receiving circuit 2032b. Consequentially, under the circumstance that none of the phase control signals is generated, the detection result of the phase detector 2055a is capable of representing the phase difference between the shifted system-clock signals sCKp2(180), sCKp1(0), as well as the receiving-path phase difference $\theta_{rxDiff}$.

Figure 10:
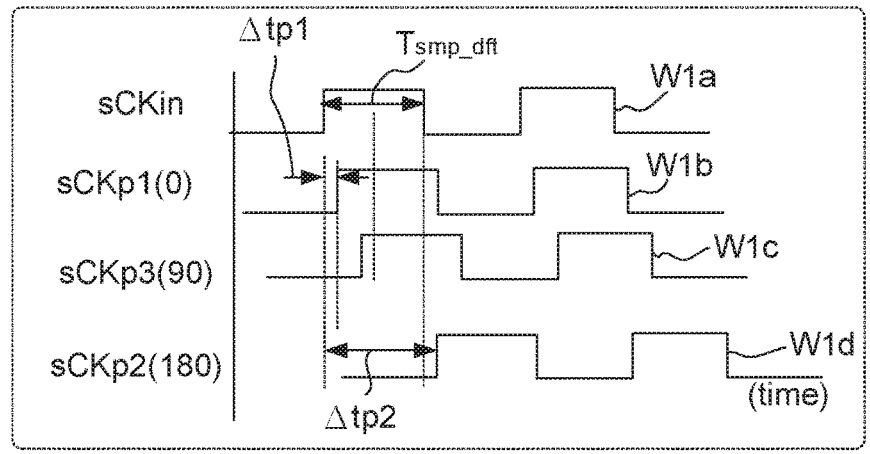
FIG. 10 is a waveform diagram illustrating that none of the phases along the data reception path and the strobe reception path is required for compensation.
Figure 11:
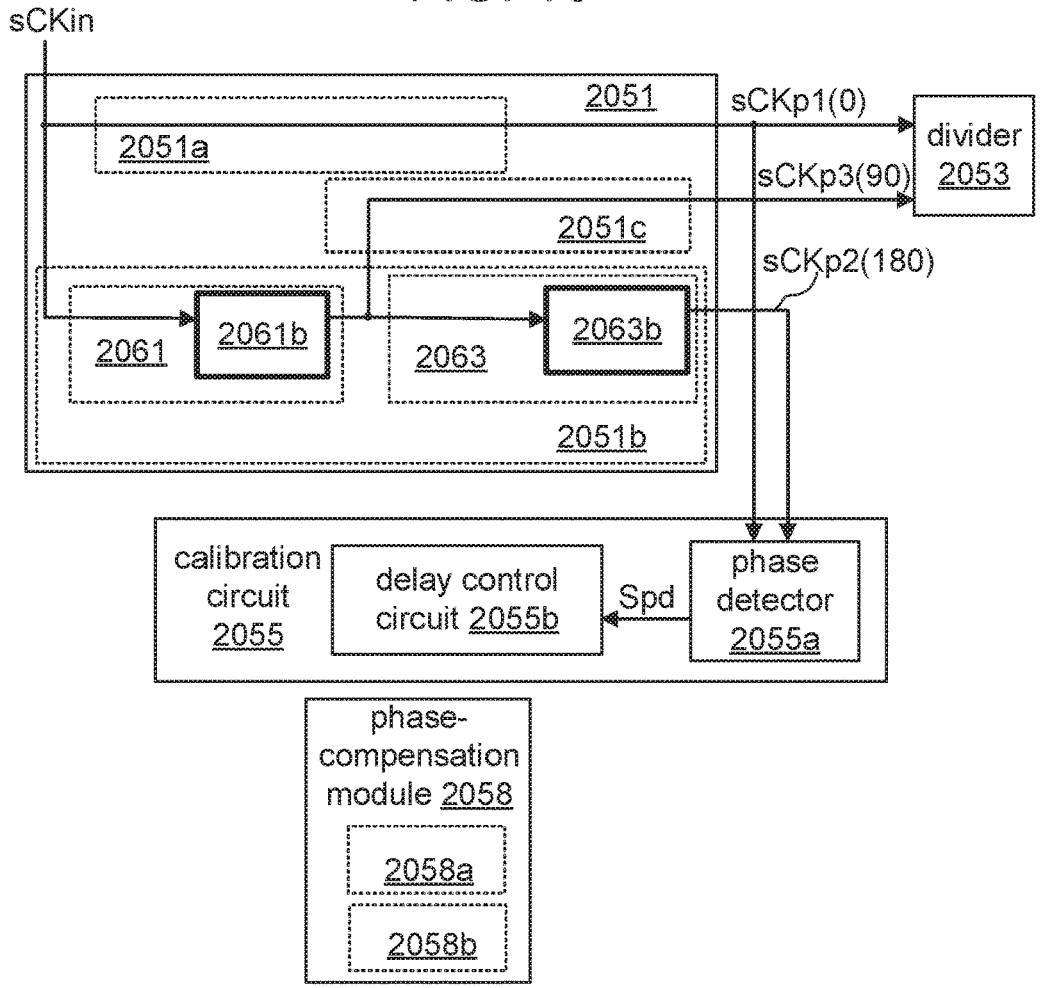
FIG. 11 is a schematic diagram illustrating the transmission path of the phase signals without compensation.
Figure 12:
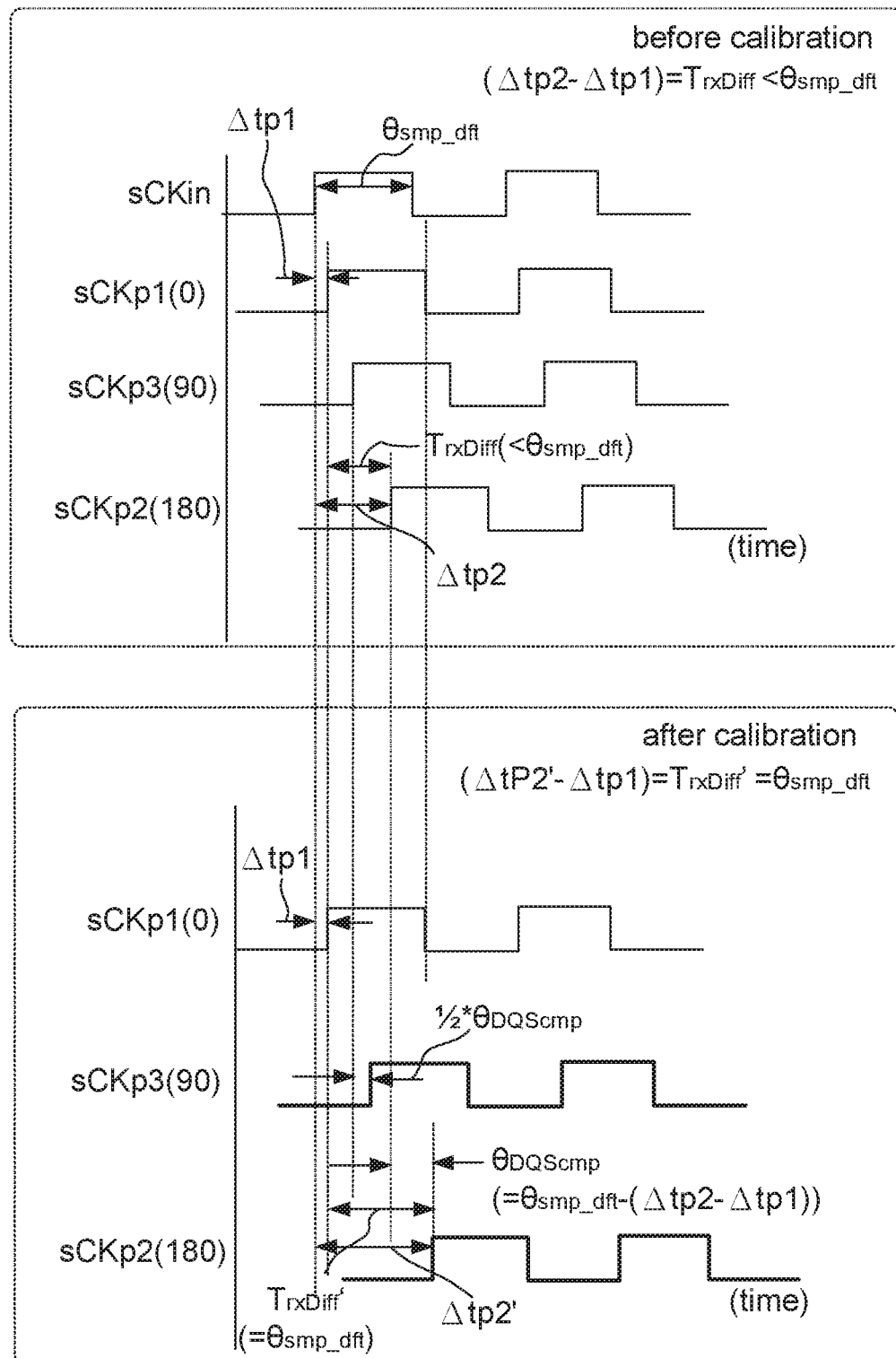
FIG. 12 is a waveform diagram illustrating the system-clock signal sCKin and the shifted system-clock signals sCKp1(0), sCKp3(90), sCKp2(180) before and after calibration operation when the phase-drift error ($\Delta$tp2-$\Delta$tp1) is less than the default sampling-phase $\theta_{smp\_dft}$.
Figure 13:
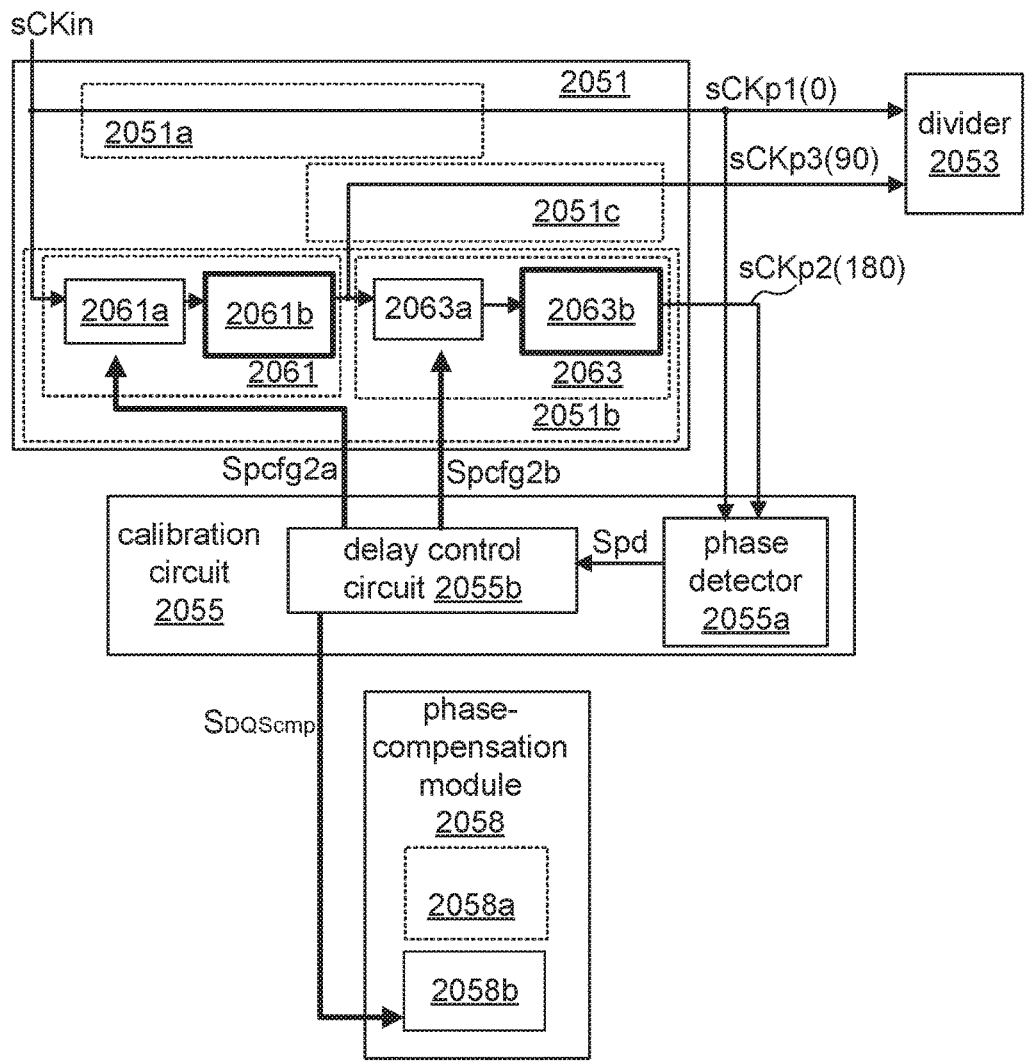
FIG. 13 is a schematic diagram illustrating the data-receiving circuit is compensated by the data-phase-compensation signal $S_{DQcmp}$, together with adjustment of the phase-generation-paths for generating shifted system-clock signals sCKp2(180) and sCKp3(90).
Figure 14:
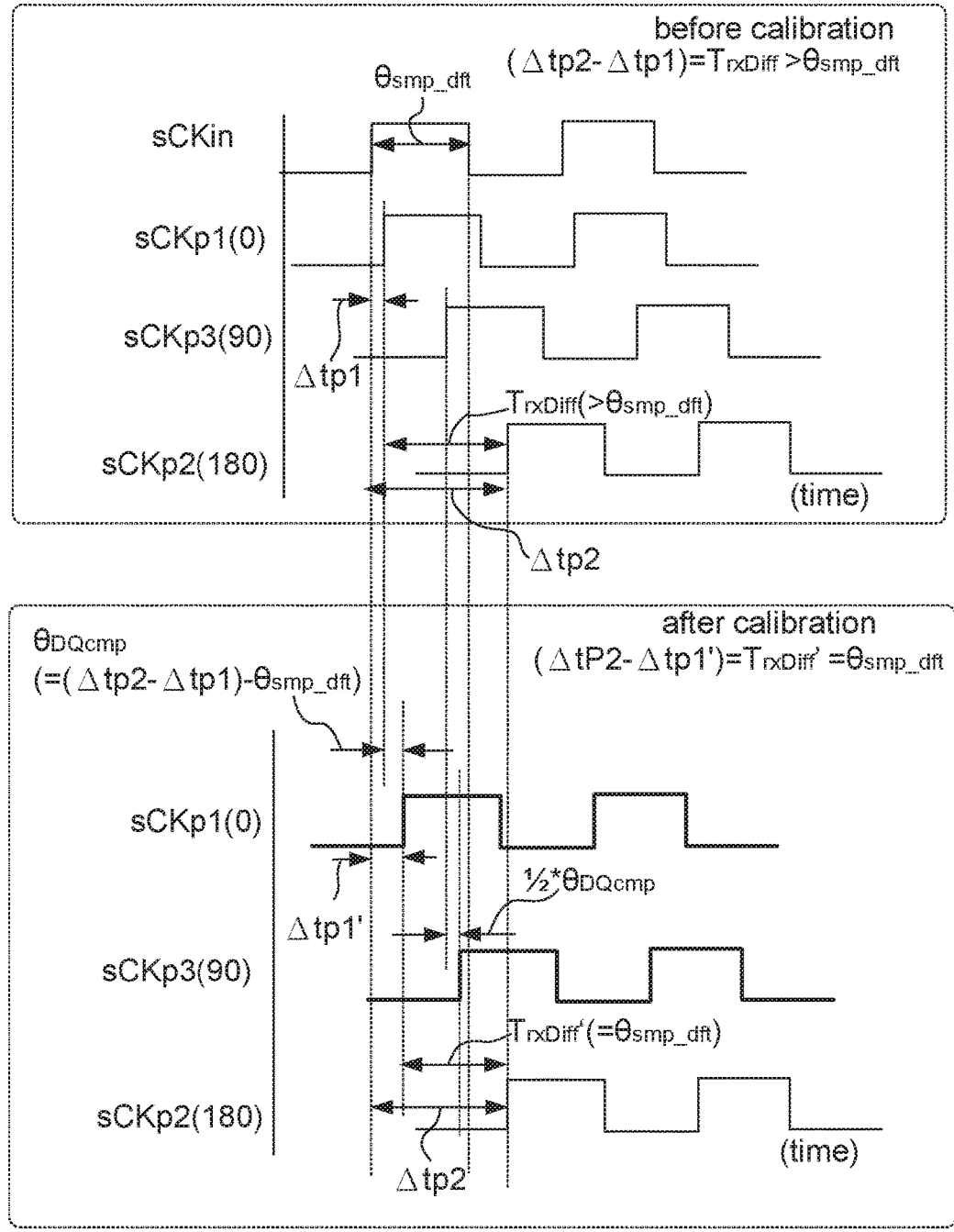
FIG. 14 is a waveform diagram illustrating the system-clock signal sCKin and the shifted system-clock signals sCKp1(0), sCKp3(90), sCKp2(180) before and after calibration operation when the phase-drift error ($\Delta$tp2-$\Delta$tp1) is greater than the default sampling-phase $\theta_{smp\_dft}$.
Figure 15:
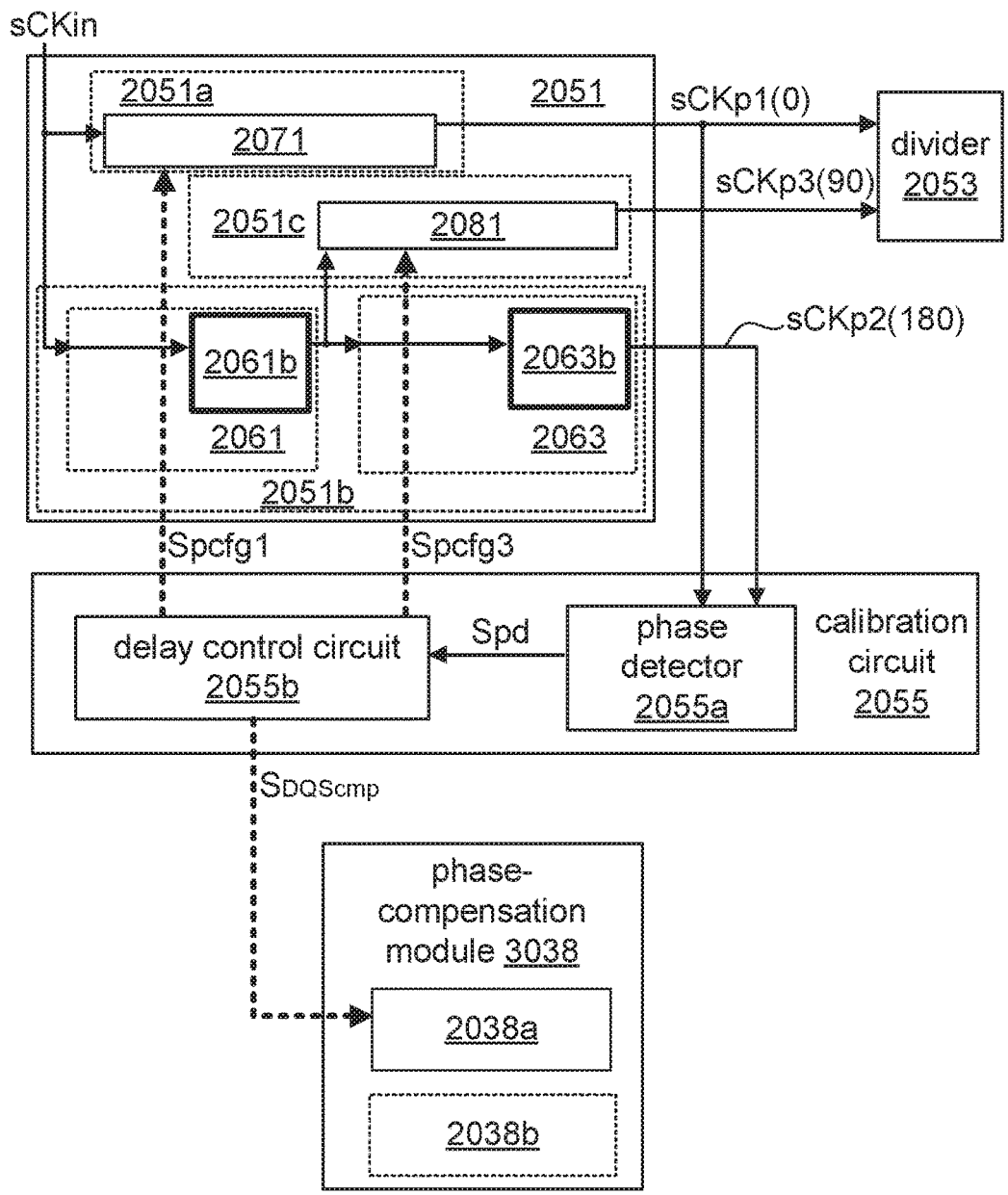
FIG. 15 is a schematic diagram illustrating the data-receiving circuit is compensated by the strobe-phase-compensation signal $S_{DQScmp}$, together with adjustment of the phase-generation-paths for generating shifted system-clock signals sCKp1(0) and sCKp3(90).

In response to the detection result of the phase detector 2055a, the delay control circuit 2055b may react differently. Firstly, the calibration circuit 2044 may suspend generation of the phase control signals if the shifted system-clock difference between the shifted system-clock signals sCKp1(0), sCKp2(180) is equivalent to the default sampling-phase $\theta_{smp\_dft}$ (FIGS. 10 and 11). Secondly, the calibration circuit 2044 may generate the first set of phase control signals if the shifted system-clock difference between the shifted system-clock signals sCKp1(0), sCKp2(180) is less than the default sampling-phase $\theta_{smp\_dft}$ (FIGS. 12 and 13). Finally, the calibration circuit 2044 may generate the second set of phase control signals if the shifted system-clock difference between the shifted system-clock signals sCKp1(0), sCKp2(180) is greater than the default sampling-phase $\theta_{smp\_dft}$ (FIGS. 14 and 15). These three cases are described respectively.

FIG. 10 is a waveform diagram illustrating that none of the phases along the data reception path and the strobe reception path is required for compensation. When the phase detector 2055a determines that the shifted system-clock difference between the shifted system-clock signals sCKp1(0), sCKp2(180) is equivalent to the default sampling-phase $\theta_{smp\_dft}$, this implies that the phase mismatch of data-receiving circuit $\theta_{dms}$ is equivalent to the phase mismatch of strobe-receiving circuit $\theta_{sms}$. Therefore, the delay control circuit 2055b generates none of the phase control signals.

FIG. 11 is a schematic diagram illustrating the transmission path of the phase signals without compensation. As none of the phase control signals is generated, the controllable phase-delay circuits 2071, 2081, 2061a, 2063b and the phase-compensation circuits 2058a, 2058b are all disabled.

Therefore, the shifted system-clock signal sCKp1(0) is generated by directly using the system-clock signal sCKin, and the shifted system-clock signal sCKp3(90) is generated by directly using the signal at the symmetric terminal Nsym. The signal at the symmetric terminal Nsym is generated by delaying the system-clock signal sCKin with the semi-default sampling-phase ($\frac{1}{2}*\theta_{smp\_dft}$) corresponding to the semi-sampling-delay matching circuit 2061b. The shifted system-clock signal sCKp2(180) is generated by delaying the signal at the symmetric terminal Nsym with the semi-default sampling-phase ($\frac{1}{2}*\theta_{smp\_dft}$) corresponding to the semi-sampling-delay matching circuit 2063b.

In other words, the shifted system-clock signal sCKp2(180) is generated by delaying the system-clock signal sCKin with the default sampling-phase $\theta_{smp\_dft}$. Moreover, the shifted system-clock signal sCKp3(90) is generated by delaying the system-clock signal sCKin with the semi-default sampling-phase ($\frac{1}{2}*\theta_{smp\_dft}$).

In practice, generation of the shifted system-clock signals sCKp1(0), sCKp2(180) and sCKp3(90) may not be identical to the ones shown in FIG. 10. Consequentially, a phase-drift error ($\Delta$tp2-$\Delta$tp1) representing the difference between the second phase-difference of shifted system-clock $\Delta$tp2 and the first phase-difference of shifted system-clock $\Delta$tp1 is not equivalent to the default sampling-phase $\theta$smp_dft.

FIG. 12 is a waveform diagram illustrating the system-clock signal sCKin and the shifted system-clock signals sCKp1(0), sCKp3(90), sCKp2(180) before and after calibration operation when the phase-drift error ($\Delta$tp2-$\Delta$tp1) is less than the default sampling-phase $\theta_{smp\_dft}$. Before the multi-phase signal generator 2051 is calibrated, the phase-drift error ($\Delta$tp2-$\Delta$tp1) is less than the default sampling-phase $\theta_{smp\_dft}$. In the specification, the receiving-circuit phase difference $\theta_{rcDiff\_dly}$ is subtationally equivalent to the phase-drift error ($\Delta$tp2-$\Delta$tp1) before the calibration circuit 2055 generates any of the phase control signals ($\theta_{rcDiff\_dly}$= ($\Delta$tp2-$\Delta$tp1) ). Thus, the receiving-circuit phase difference $\theta_{rcDiff\_dly}$ is less than the default sampling-phase $\theta_{smp\_dft}$. That is, $\theta_{rcDiff\_dly}$=($\Delta$tp2-$\Delta$tp1)<$\theta_{smp\_dft}$.

Under such circumstance, the delay control circuit 2055b generates the first set of phase control signals ($S_{pcfg2a}$, $S_{pcfg2b}$, $S_{DQScmp}$) to the controllable phase-delay circuits 2061a, 2063a, and the phase-compensation circuits 2058b. Then, phase delays along the phase-generation-paths 2051b, and the strobe reception path is adjusted accordingly.

For FIG. 12, the phase-drift error ($\Delta$tp2-$\Delta$tp1) is utilized to determine the receiving-strobe compensation $\theta_{DQScmp}$, that is, $\theta_{DQScmp}$=$\theta_{smp\_dft}$-($\Delta$tp2-$\Delta$tp1). Therefore, the shifted system-clock signal sCKp1(0) remains unchanged, the shifted system-clock signals sCKp2(180), sCKp3(90) and the receiving-delayed-strobe DQS$_{rd\_dly}$ are adjusted. The amounts of phase adjustment of the shifted system-clock signals sCKp2(180) and sCKp3(90) are determined by the phase-configuration signals $S_{pcfg2a}$, $S_{pcfg2b}$. According to the phase-configuration signals $S_{pcfg2a}$, $S_{pcfg2b}$, the shifted system-clock signal sCKp2(180) should be shifted by the receiving-strobe compensation $\theta_{DQScmp}$.

Consequentially, the difference between the rising edges of the system-clock signal sCKin and the shifted system-clock signal sCKp2(180) is increased by the receiving-strobe compensation $\theta_{DQScmp}$. The difference between the rising edges of the system-clock signal sCKin and the shifted system-clock signal sCKp2(180) after being increased is defined as an updated second phase-difference of shifted system-clock $\Delta$tp2'. Moreover, the relationship between the second phase-difference of shifted system-clock $\Delta$tp2 and the updated second phase-difference of shifted system-clock $\Delta$tp2' can be represented as $\Delta$tp2'=$\Delta$tp2+$\theta_{DQScmp}$. Meanwhile, according to the phase-configuration signals $S_{pcfg2a}$, the shifted system-clock signal sCKp3(90) should be shifted by ½*$\theta_{DQScmp}$.

After the multi-phase signal generator 2051 is calibrated, the difference between the updated second phase-difference of shifted system-clock $\Delta$tp2' and the first phase-difference of shifted system-clock $\Delta$tp1 is equivalent to the default sampling-phase $\theta_{smp\_dft}$. Thus, the receiving-path phase difference $\theta_{rxDiff}$ is equivalent to the default sampling-phase $\theta_{smp\_dft}$. That is, $\theta_{rxDiff}$=($\Delta$tp2'-$\Delta$tp1)=$\theta_{smp\_dft}$.

FIG. 13 is a schematic diagram illustrating the data-receiving circuit is compensated by the data-phase-compensation signal $S_{DQcmp}$, together with adjustment of phase-generation-paths for generating the shifted system-clock signals sCKp2(180) and sCKp3(90). Please refer to FIG. 13 and Table 1 together.

TABLE 1

| | | ($\Delta$tp2 − $\Delta$tp1) < $\theta_{smp\_dft}$. |
|---|---|---|
| phase control signals generated by the calibration circuit | first set of phase control signals | $S_{pcfg2a}$ is transmitted to the controllable phase-delay circuit 2061a |
| | | $S_{pcfg2b}$ is transmitted to the controllable phase-delay circuit 2063a |
| | | $S_{DQScmp}$ is transmitted to the phase-compensation circuit 2058b |
| | second set of phase control signals | none of $S_{pcfg1}$, $S_{pcfg3}$, $S_{DQcmp}$ is generated |
| multi-phase signal generator | sCKp1(0) | controllable phase-delay circuit 2071 is disabled. Bypass sCKin as sCKp1(0) |
| | sCKp3(90) | controllable phase-delay circuit 2081 is disabled. Bypass signal at Nysm as sCKp3(90) |
| | sCKp2(180) | controllable phase-delay circuits 2061a, 2063a are enabled. Shift sCKin with the delay caused by controllable phase-delay circuits 20161a, 2063a and semi-sampling-delay matching circuits 2061b, 2063b |
| phase-compensation module | phase-compensation circuit 2058a (data) | Bypass DQ$_{rd\_dly}$ as DQ$_{rx}$ |
| | phase-compensation circuit 2058b (strobe) | enabled by $S_{DQScmp}$ shift DQS$_{rd\_dly}$ with $\theta_{DQScmp}$ to generate DQS$_{rx}$ $\theta_{DQScmp}$ = $\theta_{smp\_dft}$ − ($\Delta$tp2 − $\Delta$tp1)) |

When the phase comparison signal Spd represents that ($\Delta$tp2-$\Delta$tp1)<$\theta_{smp\_dft}$, the delay control circuit 2055b generates the first set of phase control signals but suspends generating the second set of phase control signals. The phase-configuration signal $S_{pcfg2a}$ is transmitted to the controllable phase-delay circuit 2061a, the phase-configuration signal $S_{pcfg2b}$ is transmitted to the controllable phase-delay circuit 2063a. and the strobe-phase-compensation signal $S_{DQScmp}$ is transmitted to the phase-compensation circuit 2058b.

For the phase-generation-path 2051a, the controllable phase-delay circuit 2071 is disabled because the phase-configuration signal $S_{pcfg1}$ is not generated. Thus, no extra delay is caused at the phase-generation-path 2051a. Therefore, the system-clock signal sCKin is directly used as the shifted system-clock signal sCkp1(0).

For the phase-generation-path 2051c, the controllable phase-delay circuit 2081 is disabled because the phase-configuration signal $S_{pcfg3}$ is not generated. Thus, the shifted system-clock signal sCKp3(90) can be obtained by acquiring the signal at the symmetric terminal Nsym. Moreover, the signal at the symmetric terminal Nsym can be obtained by shifting the sCKin with (½*$\theta_{DQScmp}$+½*$\theta_{smp\_dft}$), that is, the summation of controllable delay caused by the controllable phase-delay circuit 2061a (½*$\theta_{DQScmp}$) and the semi-default sampling-phase caused by the semi-sampling-delay matching circuit 2061b (½*$\theta_{smp\_dft}$).

For the phase-generation-path 2051b, the controllable phase-delay circuits 2061a, 2063a are enabled because the phase-configuration signals $S_{pcfg2a}$, $S_{pcfg2b}$ are generated. Therefore, the shifted system-clock signal sCKp2(180) can be obtained by delaying the system-clock signal sCKin with summation of the receiving-strobe compensation $\theta_{DQScmp}$ and the default sampling-phase ($\theta_{DQScmp}$+$\theta_{smp\_dft}$), which can be obtained by summing the controllable delays caused by the controllable phase-delay circuit 2061a, 2063a ($\frac{1}{2}*\theta_{DQScmp}$ of each) and semi-default sampling-phase caused by the semi-sampling-delay matching circuit 2061b, 2063b ($\frac{1}{2}*\theta_{smp\_dft}$ of each).

The phase-compensation circuit 2058b receives the strobe-phase-compensation signal $S_{DQScmp}$ from the delay control circuit 2055b. Then, the phase-compensation circuit 2058b shifts the receiving-delayed-strobe $DQS_{rd\_dly}$ with the receiving-strobe compensation $\theta_{DQScmp}$ and generates the receiving-path-strobe $DQS_{rx}$ accordingly.

FIG. 14 is a waveform diagram illustrating the system-clock signal sCKin and the shifted system-clock signals sCKp1(0), sCKp3(90), sCKp2(180) before and after calibration operation when the phase-drift error (Δtp2-Δtp1) is greater than the default sampling-phase $\theta_{smp\_dft}$. Before the multi-phase signal generator 2051 is calibrated, the difference between the second phase-difference of shifted system-clock Δtp2 and the first phase-difference of shifted system-clock Δtp1 is greater than the default sampling-phase $\theta_{smp\_dft}$. In the specification, the receiving-circuit phase difference $\theta_{rcDiff\_dly}$ is subtationally equivalent to the phase-drift error (Δtp2-Δtp1) before the calibration circuit 2055 generates any of the phase control signals ($\theta_{rcDiff\_dly}$=(Δtp2-Δtp1)). Thus, the receiving-circuit phase difference $\theta_{rcDiff\_dly}$ is greater than the default sampling-phase $\theta_{smp\_dft}$. That is, $\theta_{rcDiff\_dly}$=(Δtp2-Δtp1)>$\theta_{smp\_dft}$.

Under such circumstance, the delay control circuit 2055b generates the second set of phase control signals ($S_{pcfg1}$, $S_{pcfg3}$, $S_{DQcmp}$) to the controllable phase-delay circuits 2071, 2081, and the phase-compensation circuit 2058a. Then, phase delays along the phase-generation-paths 2051a, 2051c, and the data reception path are adjusted accordingly.

For FIG. 14, the phase-drift error (Δtp2-Δtp1) is utilized to determine the receiving-data compensation $\theta_{DQcmp}$, that is, $\theta_{DQcmp}$=(Δtp2-Δtp1)-$\theta_{smp\_dft}$ Therefore, the shifted system-clock signal sCKp2(180) remains unchanged, the shifted system-clock signals sCKp1(0), sCKp3(90) and the receiving-delayed-data $DQ_{rd\_dly}$ are adjusted. The amounts of phase adjustment of the shifted system-clock signals sCKp1(0) and sCKp3(90) are respectively determined by the phase-configuration signals $S_{pcfg1}$, $S_{pcfg3}$. According to the phase-configuration signals $S_{pcfg1}$, the shifted system-clock signal sCKp1(0) should be shifted by the receiving-strobe compensation $\theta_{DQScmp}$.

Consequentially, the difference between the rising edges of the system-clock signal sCKin and the shifted system-clock signal sCKp1(0) is increased by the receiving-strobe compensation θDQScmp. The difference between the rising edges of the system-clock signal sCKin and the shifted system-clock signal sCKp1(0) after being increased is defined as an updated first phase-difference of shifted system-clock Δtp1'. Moreover, the relationship between the first phase-drift of shifted system clock Δtp1 and the updated first phase-difference of shifted system-clock Δtp1' can be represented as Δtp1'=Δtp1+θDQcmp. According to the phase-configuration signals Spcfg3, the system-clock signal sCKp3(90) should be shifted by $\frac{1}{2}*$θDQScmp.

After the multi-phase signal generator 2051 is calibrated, the difference between the second phase-difference of shifted system-clock Δtp2 and the updated first phase-difference of shifted system-clock Δtp1' is equivalent to the default sampling-phase $\theta_{smp\_dft}$. Thus, the receiving-path phase difference $\theta_{rxDiff}$ is equivalent to the default sampling-phase $\theta_{smp\_dft}$. That is, $\theta_{rxDiff}$=(Δtp2-Δtp1')=$\theta_{smp\_dft}$.

FIG. 15 is a schematic diagram illustrating the data-receiving circuit is compensated by the strobe-phase-compensation signal $S_{DQScmp}$, together with adjustment of phase-generation-paths for generating the shifted system-clock signals sCKp1(0) and sCKp3(90). Please refer to FIG. 15 and Table 2 together.

TABLE 2

| | | (Δtp2 – Δtp1) > $\theta_{smp\_dft}$. |
|---|---|---|
| Phase control signals generated by the calibration circuit | first set of phase control signals | none of $S_{pcfg2a}$, $S_{pcfg2b}$, $S_{DQScmp}$ is generated |
| | second set of phase control signals | $S_{pcfg1}$ is transmitted to he controllable phase-delay circuit 2071 |
| | | $S_{pcfg3}$ is transmitted to the controllable phase-delay circuit 2081 |
| | | $S_{DQcmp}$ is transmitted to the phase-compensation circuit 2058a |
| multi-phase signal generator | sCKp1(0) | controllable phase-delay circuit 2071 is enabled by Spcfg1. |
| | | delay sCKin with $\theta_{DQScmp}$ to generate sCKp3(0) |
| | sCKp3(90) | controllable phase-delay circuit 2081 is enabled by Scfg3. |
| | | delay signal at Nysm with $\frac{1}{2}*\theta_{DQScmp}$ to generate sCKp3(90) |
| | sCKp2(180) | controllable phase-delay circuits 2061a, 2063a are disabled. |
| | | shift sCKin with the delay caused by semi-sampling-delay matching circuits 2061b, 2063b to generate sCKp2(180) |
| phase-compensation module | Phase-compensation circuit 2058a (data) | enabled by $S_{DQcmp}$ shift $DQ_{rd\_dly}$ with $\theta_{DQcmp}$ to generate $DQ_{rx}$ |
| | | $\theta_{DQcmp}$ = (Δtp2 – Δtp1) – $\theta_{smp\_dft}$ |
| | Phase-compensation circuit 2058b (strobe) | Bypass $DQS_{rd\_dly}$ as $DQS_{rx}$ |

When the phase comparison signal Spd represents that (Δtp2-Δtp1)>$\theta_{smp\_dft}$, the delay control circuit 2055b generates the second set of phase control signals but suspends generating the first set of phase control signals. The phase-configuration signal $S_{pcfg1}$ is transmitted to the controllable phase-delay circuit 2071, the phase-configuration signal $S_{pcfg2b}$ is transmitted to the controllable phase-delay circuit 2081. and the data-phase-compensation signal $S_{DQcmp}$ is transmitted to the phase-compensation circuit 2058a.

For the phase-generation-path 2051a, the controllable phase-delay circuit 2071 is enabled because the phase-configuration signal $S_{pcfg1}$ is generated. Thus, extra delay is caused at the phase-generation-path 2051a. Therefore, the shifted system-clock signal sCkp1(0) can be generated by delaying the system-clock signal sCKin with $\theta_{DQcmp}$, that is, the controllable delay caused by the controllable phase-delay circuit 2071.

For the phase-generation-path 2051c, the controllable phase-delay circuit 2081 is enabled because the phase-configuration signal $S_{pcfg2}$ is generated. As the input of the controllable phase-delay circuit 2081 is conducted from the symmetric terminal Nsym, the shifted system-clock signal sCkp3(90) can be obtained by delaying the signal at the symmetric terminal Nsym with $\frac{1}{2}*\theta_{DQcmp}$, that is, the controllable delay caused by the controllable phase-delay circuit 2081. Furthermore, the signal at the symmetric terminal Nsym can be obtained by delaying the system-clock signal sCKin with ($\frac{1}{2}*\theta_{smp\_dft}$), that is, the semi-sampling-predefined delay caused by the semi-sampling-delay matching circuit 2061b. Therefore, the shifted system-clock signal sCkp3(90) can be obtained by shifting the system-clock signal sCKin with ($\frac{1}{2}*\theta_{DQcmp}+\frac{1}{2}*\theta_{smp\_dft}$).

For the phase-generation-path 2051b, the controllable phase-delay circuits 2061a, 2063a are disabled because the phase-configuration signals $S_{pcfg2a}$, $S_{pcfg2b}$ are not generated. Therefore, the shifted system-clock signal sCKp2(180) can be obtained by delaying the system-clock signal sCKin with the receiving-circuit phase difference $\theta_{rcDiff\_dly}$, that is, the summation of semi-default sampling-phases caused by the semi-sampling-delay matching circuits 2061b, 2063b ($\frac{1}{2}*\theta_{smp\_dft}+\frac{1}{2}*\theta_{smp\_dft}=\theta_{smp\_dft}$).

The phase-compensation circuit 2058a receives the data-phase-compensation signal $S_{DQcmp}$ from the delay control circuit 2055b. Then, the phase-compensation circuit 2058a shifts the receiving-delayed-data $DQ_{rd\_dly}$ with the receiving-data compensation $\theta_{DQcmp}$ and generates the receiving-path-data $DQ_{rx}$ accordingly.

Figure 16:
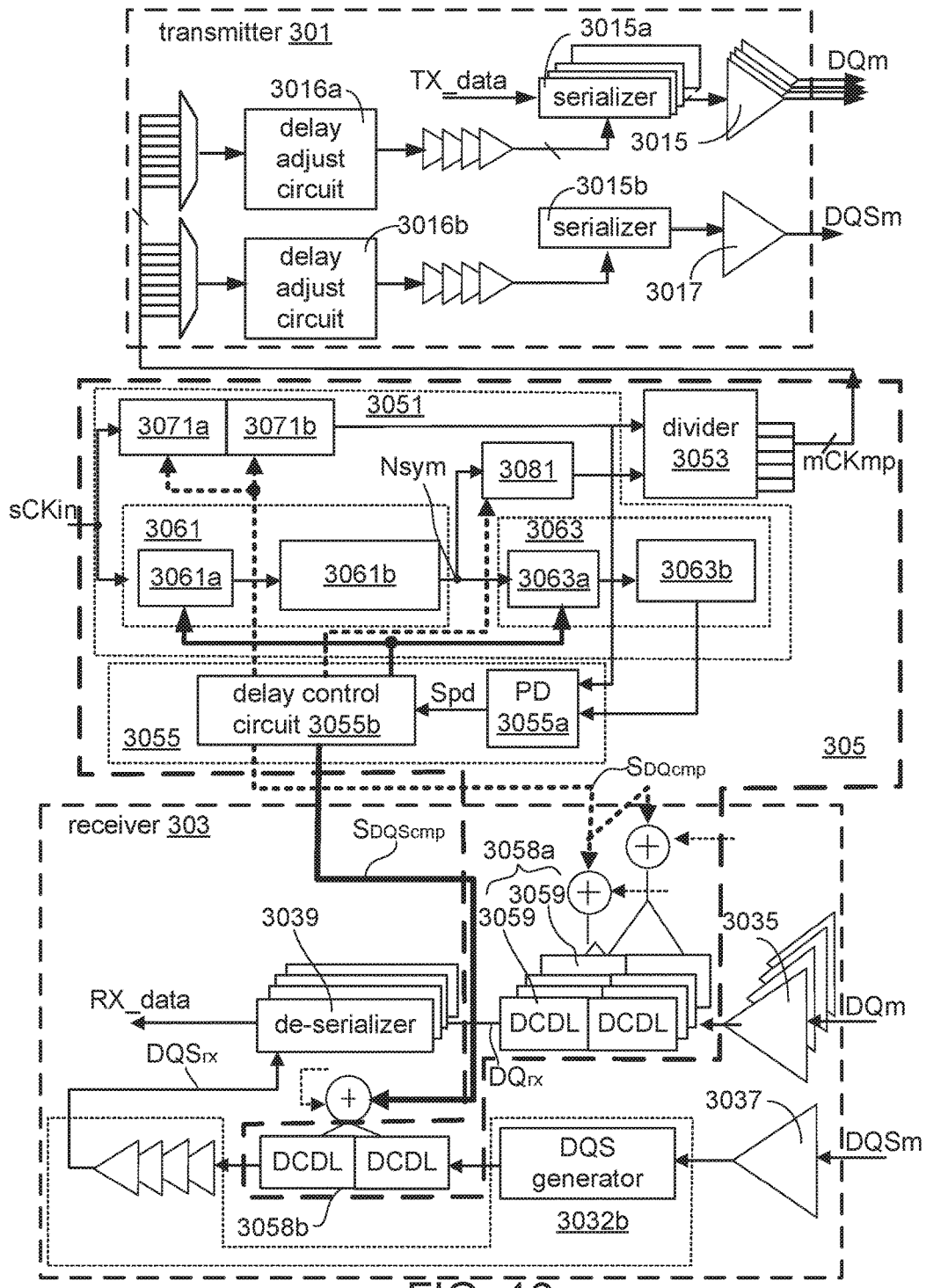
FIG. 16 is a schematic diagram illustrating an exemplary implementation of the transceiver according to the embodiment of the present disclosure.

FIG. 16 is a schematic diagram illustrating an exemplary implementation of the transceiver according to the embodiment of the present disclosure. The transceiver includes a transmitter 301, a cock generation module 305 and a receiver 303.

The transmitter 301 includes delay adjust circuits 3016a, 3016b, serializers 3015a, 3015b, data output buffers 3015, and a strobe output buffer 3015b. The number of the serializers 3015a and the data output buffers 3015 are related to the number of data bits. The receiver 303 includes data input buffers 3035, a strobe input buffer 3037, a strobe generator 3032b, and a de-serializer 3039. 3058a. The number of the de-serializer 3039 is related to the number of data bits.

The clock generation module 305 includes a multi-phase signal generator 3051, a divider 3053, a calibration circuit 3055, and phase-compensation circuits 3058a, 3058b. The multi-phase signal generator 3051 includes controllable phase-delay circuits 3071a, 3071b, 3081, 3061a, 3063a and semi-sampling-delay matching circuits 3061b 3063b. The controllable phase-delays circuits 3071a, 3071b constructs the phase-generation-path of the shifted system-clock signal sCKp1(0). The controllable phase-delays circuit 3081 is electrically connected to symmetric terminal Nsym to construct the phase-generation-path of the shifted system-clock signal sCKp3(90). The controllable phase-delays circuit 3061a and the semi-sampling-delay matching circuit 3061b collectively construct a symmetric sub-circuit 3061, and the controllable phase-delays circuit 3063a and the semi-sampling-delay matching circuit 3063b collectively construct a symmetric sub-circuit 3063. The symmetric sub-circuits 3061, 3063 jointly construct the phase-generation-path of the shifted system-clock signal sCKp2(180).

The divider 3053 receives the shifted system-clock signals sCKp1(0), sCKp3(90) to generate the multi-phase memory-clock signals mCKmp. The calibration circuit 3055 includes a phase detector 3055a and a delay control circuit 3055b.

The phase-compensation circuit 3058a is placed in the data reception path, and the phase-compensation circuit 3058b is placed in the strobe reception path. The strobe-phase-compensation signal $S_{DQScmp}$ carries DQS offset code to set the cascaded DCDL pairs in phase-compensation circuit 3058b. The data-phase-compensation signal $S_{DQcmp}$ carries DQ offset code to set the DCDL pair in phase-compensation circuit 3058b.

In practical application, the phase-compensation circuits 3058a, 3058b can be considered as part of the receiver or as a part of the clock generation module 305. Moreover, the cascaded DCDL pairs 3059 may be controlled by two sources. That is, the cascaded DCDL pairs 3059 may receive a common DQ offset code being equally applied to all the cascaded DCDL pairs 3059, and several unique DQ offset codes which are separately applied to each of the DCDL pairs 3059. The common DQ offset code is determined by the data-phase-compensation signal $S_{DQcmp}$, and the unique DQ offset codes are respectively related to different data bits.

As illustrated above, the transceiver according to the embodiment of the present disclosure has a self-adjusting function so that the receiving-path phase difference ($\theta_{rxDiff}$) between the receiving-path-data ($DQ_{rx}$) and the receiving-path-strobe ($DQS_{rx}$) is maintained in a real-time manner. With the clock generation module, the transceiver is capable of instantaneously calibrating phases of signals related to the transmitter and/or the receiver. Although the examples illustrated above are based on the DDR memory, the embodiments can be applied to single data rate synchronous DRAM (SDR) or other types of circuits using the data strobe encoding by merely changing phase difference settings.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A transceiver, comprising:
   a receiver, configured to receive a receiving-input-data and a receiving-input-strobe, wherein the receiving-input-data and the receiving-input-strobe have a receiving-input phase difference, and the receiver comprises:
   a data-receiving circuit configured to delay the receiving-input-data and accordingly generate a receiving-delayed-data;
   a strobe-receiving circuit, configured to delay the receiving-input-strobe and accordingly generate a receiving-delayed-strobe; and
   a clock generation module, electrically connected to the receiver, comprising:
   a calibration circuit, configured to selectively generate one of a first set of phase control signals comprising a strobe-phase-compensation signal and a second set of phase control signals comprising a data-phase-compensation signal; and
   a phase-compensation module, comprising:
   a data-phase-compensation circuit, electrically connected to the data-receiving circuit and the calibration circuit, configured to generate a receiving-path-data by delaying the receiving-delayed-data with a receiving-data compensation when the data-phase-compensation signal is generated; and
   a strobe-phase-compensation circuit, electrically connected to the strobe-receiving circuit and the calibration circuit, configured to generate a receiving-path-strobe by delaying the receiving-delayed-strobe with a receiving-strobe compensation when the strobe-phase-compensation signal is generated,
   wherein the receiving-path-data and the receiving-path-strobe have a receiving-path phase difference which is different from the receiving-input phase difference; and
   a multi-phase signal generator, electrically connected to the calibration circuit, configured to generate a first shifted system-clock signal and a second shifted system-clock signal based on a system-clock signal, wherein a first shifted system-clock difference between the second shifted system-clock signal and the first shifted system-clock signal is equivalent to the receiving-path phase difference.

2. The transceiver according to claim 1, wherein the receiving-input-data and the receiving-input-strobe are edge-aligned, and the receiving-path-strobe is 90 degrees out of phase with the receiving-path-data.

3. The transceiver according to claim 1, wherein the multi-phase signal generator further generates a third shifted system-clock signal, and a second shifted system-clock difference between the third shifted system clock and the first shifted system-clock signal is equivalent to a third shifted system-clock difference between the second shifted system-clock signal and the third sifted system-clock signal, wherein
the first shifted system-clock difference is equivalent to a summation of the second shifted system-clock difference and the third shifted system-clock difference.

4. The transceiver according to claim 3, wherein the transceiver further comprises a transmitter and the clock generation module further comprises:
a divider, electrically connected to the multi-phase signal generator and the transmitter, configured to receive the first shifted system-clock signal and the third shifted system-clock signal, and accordingly generate a plurality of multi-phase memory-clock signals.

5. The transceiver according to claim 4, wherein cycle of the system-clock signal is equivalent to half of cycles of the plurality of multi-phase memory-clock signals.

6. The transceiver according to claim 1, wherein the multi-phase signal generator comprises:
a first phase-generation-path, configured to receive the system-clock signal and generate the first shifted system-clock signal according to a first phase-configuration signal from the calibration circuit;
a second phase-generation-path, comprising:
a first sub-circuit, electrically connected to a symmetric terminal and configured to receive the system-clock signal and selectively receive a first-second phase-configuration signal from the calibration circuit; and
a second sub-circuit, electrically connected to the symmetric terminal, configured to selectively receive a second-second phase-configuration signal from the calibration circuit and generate the second shifted system-clock signal, wherein the first sub-circuit and the second sub-circuit are symmetric; and
a third phase-generation-path, electrically connected to the symmetric terminal, configured to selectively receive a third phase-configuration signal from the calibration circuit and generate the third system-clock signal,
wherein the first set of phase control signals further comprises the first-second phase-configuration signal and the second-second phase-configuration signal, and the second set of phase control signals further comprises the first phase-configuration signal and the third phase-configuration signal.

7. The transceiver according to claim 6, wherein
the calibration circuit generates the first set of phase control signals when phase difference between the receiving-delayed-strobe, and the receiving-delayed-data is satisfied with a first predefined comparison condition; and the calibration circuit generates the second set of phase control signals when the phase difference between the receiving-delayed-strobe, and the receiving-delayed-data is satisfied with a second predefined comparison condition,
wherein the receiving-delayed-data is corresponding to the first shifted system-clock signal, and the receiving-delayed-strobe is corresponding to the second shifted system-clock signal.

8. The transceiver according to claim 7, wherein
the first predefined comparison condition is satisfied when the phase difference between the second shifted system-clock signal and the first shifted system-clock signal is greater than a default sampling-phase; and
the second predefined comparison condition is satisfied when the phase difference between the second shifted system-clock signal and the first shifted system-clock signal is less than the default sampling-phase.

9. The transceiver according to claim 8, wherein the default sampling-phase is equivalent to half of cycle of the system-clock signal.

10. The transceiver according to claim 6, wherein the first phase-generation-path comprises:
a first controllable phase-delay circuit, configured to delay the system-clock signal with a first controllable phase-delay to generate the first shifted system-clock signal when the first phase-configuration signal is generated.

11. The transceiver according to claim 10, wherein
the first sub-circuit comprises:
a second controllable phase-delay circuit corresponding to a second controllable phase-delay; and
a first semi-sampling-delay matching circuit corresponding to a first semi-default sampling-phase; and
the second sub-circuit comprises:
a third controllable phase-delay circuit corresponding to a third controllable phase-delay; and
a second semi-sampling-delay matching circuit corresponding to a second semi-default sampling-phase,
wherein the second controllable phase-delay is equivalent to the third controllable phase-delay, and the first semi-default sampling-phase is equivalent to the second semi-default sampling-phase.

12. The transceiver according to claim 11, wherein summation of the first semi-default sampling-phase and the second semi-default sampling-phase is equivalent to half of cycle of the system-clock signal.

13. The transceiver according to claim 11, wherein
the first sub-circuit is configured to delay the system-clock signal with the second controllable phase-delay and the first semi-default sampling-phase and generate a signal at the symmetric terminal when the first-second phase-configuration signal is generated; and
the second sub-circuit is configured to delay the signal at the symmetric terminal with the third controllable phase-delay and the second semi-default sampling-phase to generate the second shifted system-clock signal when the second-second phase-configuration signal is generated.

14. The transceiver according to claim 13, wherein the third phase-generation-path comprises:
a fourth controllable phase-delay circuit, configured to delay the signal at the symmetric terminal with a fourth controllable phase-delay to generate the third shifted system-clock signal when the third phase-configuration signal is generated.

15. The transceiver according to claim 14, wherein the third phase-generation-path utilizes the signal at the symmetric terminal as the third shifted system-clock signal when the third phase-configuration signal is not generated.

16. The transceiver according to claim 14, wherein
the first controllable phase-delay circuit and the fourth phase delay circuit are disabled when the first predefined comparison condition is unsatisfied; and
the second controllable phase-delay circuit and the third phase delay circuit are disabled when the second predefined comparison condition is unsatisfied.

17. The transceiver according to claim 6, wherein the calibration circuit comprises:
a phase detector, electrically connected to the first phase-generation-path and the second phase-generation-path, configured to receive the first shifted system-clock signal and the second shifted system-clock signal and generate a phase comparison signal according to comparison of phases of the first shifted system-clock signal and the second shifted system-clock signal; and
a delay control circuit, electrically connected to the phase detector, configured to generate the first set of phase control signals and the second set of phase control signals according to the phase comparison signal.

18. The transceiver according to claim 1, wherein the multi-phase signal generator receives the system-clock signal from a phase-locked loop (hereinafter, PLL) circuit.

19. A clock generation module, electrically connected to a receiver, wherein the receiver receives a receiving-input-data and a receiving-input-strobe, wherein the receiving-input-data and the receiving-input-strobe have a receiving-input phase difference, the receiving-input-data is delayed to generate a receiving-delayed-data, and the receiving-input-strobe is delayed to generate a receiving-delayed-strobe, and the clock generation module comprises:
a calibration circuit, configured to selectively generate one of a first set of phase control signals comprising a strobe-phase-compensation signal and a second set of phase control signals comprising a data-phase-compensation signal; and
a phase-compensation module, comprising:
a data-phase-compensation circuit, electrically connected to the receiver, configured to generate a receiving-path-data by delaying the receiving-delayed-data with a receiving-data compensation when the data-phase-compensation signal is generated; and
a strobe-phase-compensation circuit, electrically connected to the strobe-receiving circuit and the calibration circuit, configured to generate a receiving-path-strobe by delaying the receiving-delayed-strobe with a receiving-strobe compensation when the strobe-phase-compensation signal is generated,
wherein the receiving-path-data and the receiving-path-strobe have a receiving-path phase difference which is different from the receiving-input phase difference; and
a multi-phase signal generator, electrically connected to the calibration circuit, configured to generate a first shifted system-clock signal and a second shifted system-clock signal based on a system-clock signal, wherein a first shifted system-clock difference between the second shifted system-clock signal and the first shifted system-clock signal is equivalent to the receiving-path phase difference.

* * * * *